United States Patent
Sampath et al.

(10) Patent No.: US 8,462,859 B2
(45) Date of Patent: Jun. 11, 2013

(54) SPHERE DECODING APPARATUS

(75) Inventors: Hemanth Sampath, San Diego, CA (US); Tamer Kadous, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 772 days.

(21) Appl. No.: 11/445,377

(22) Filed: May 31, 2006

(65) Prior Publication Data

US 2006/0274836 A1    Dec. 7, 2006

Related U.S. Application Data

(60) Provisional application No. 60/686,819, filed on Jun. 1, 2005.

(51) Int. Cl.
*H04L 27/28* (2006.01)

(52) U.S. Cl.
USPC ........... 375/260; 375/141; 375/148; 375/340; 370/465; 370/479

(58) Field of Classification Search
USPC ................. 375/260, 262, 265, 267, 340, 341, 375/141, 147, 148; 370/464, 465, 479–480
See application file for complete search history.

(56) References Cited

U.S. PATENT DOCUMENTS

| | | |
|---|---|---|
| 4,393,276 A | 7/1983 | Steele |
| 4,554,668 A | 11/1985 | Deman et al. |
| 4,747,137 A | 5/1988 | Matsunaga |
| 4,783,779 A | 11/1988 | Takahata et al. |
| 4,783,780 A | 11/1988 | Alexis |
| 4,975,952 A | 12/1990 | Mabey et al. |
| 5,008,900 A | 4/1991 | Critchlow et al. |
| 5,115,248 A | 5/1992 | Roederer |
| 5,268,694 A | 12/1993 | Jan et al. |

(Continued)

FOREIGN PATENT DOCUMENTS

| | | |
|---|---|---|
| AU | 2005319084 | 4/2010 |
| CA | 2348137 | 11/2001 |

(Continued)

OTHER PUBLICATIONS

Hochwald et al., "Achieving near-capacity on a multiple-antenna channel," IEEE Transactions on Communications, IEEE Service Center, Piscataway, New Jersey, vol. 51, No. 3, pp. 389-399 (2003) XP-001163616.

(Continued)

*Primary Examiner* — Dac Ha
(74) *Attorney, Agent, or Firm* — Stanton Braden

(57) ABSTRACT

Methods and apparatuses for decoding codewords received over a MIMO channel are provided. According to one aspect of the disclosure, a cost function is computed for each constellation point of an Mth rank or spatial layer, and $N_{cand}$ of those constellation points having minimum cost are preserved as candidate points, where $N_{cand}$ is a parameter specified to the decoding algorithm. In addition, a cost function may be computed for all possible transitions from the $N_{cand}$ candidate points of the Mth rank to all possible constellation points of the (M−1)th spatial layer, and $N_{cand}$ of those transitions having minimum cost are preserved as candidate points. The process is repeated for all spatial layers, resulting in the identification of $N_{cand}$ candidate codewords and their associated cost functions.

38 Claims, 10 Drawing Sheets

U.S. PATENT DOCUMENTS

| | | | |
|---|---|---|---|
| 5,282,222 | A | 1/1994 | Fattouche et al. |
| 5,363,408 | A | 11/1994 | Paik et al. |
| 5,371,761 | A | 12/1994 | Daffara et al. |
| 5,384,810 | A | 1/1995 | Amrany |
| 5,406,551 | A | 4/1995 | Saito et al. |
| 5,410,538 | A | 4/1995 | Roche et al. |
| 5,455,839 | A | 10/1995 | Eyuboglu |
| 5,465,253 | A | 11/1995 | Rahnema |
| 5,491,727 | A | 2/1996 | Petit |
| 5,513,379 | A | 4/1996 | Benveniste et al. |
| 5,539,748 | A | 7/1996 | Raith |
| 5,548,582 | A | 8/1996 | Brajal et al. |
| 5,583,869 | A | 12/1996 | Grube et al. |
| 5,594,738 | A | 1/1997 | Crisler et al. |
| 5,604,744 | A | 2/1997 | Andersson et al. |
| 5,612,978 | A | 3/1997 | Blanchard et al. |
| 5,625,876 | A | 4/1997 | Gilhousen et al. |
| 5,684,491 | A | 11/1997 | Newman et al. |
| 5,726,978 | A | 3/1998 | Frodigh et al. |
| 5,732,113 | A | 3/1998 | Schmidl et al. |
| 5,745,487 | A | 4/1998 | Hamaki |
| 5,768,276 | A | 6/1998 | Diachina et al. |
| 5,790,537 | A | 8/1998 | Yoon et al. |
| 5,812,938 | A | 9/1998 | Gilhousen et al. |
| 5,815,488 | A | 9/1998 | Williams et al. |
| 5,822,368 | A | 10/1998 | Wang |
| 5,838,268 | A | 11/1998 | Frenkel |
| 5,867,478 | A | 2/1999 | Baum et al. |
| 5,870,393 | A | 2/1999 | Yano |
| 5,887,023 | A | 3/1999 | Mabuchi |
| 5,907,585 | A | 5/1999 | Suzuki et al. |
| 5,920,571 | A | 7/1999 | Houck et al. |
| 5,926,470 | A | 7/1999 | Tiedemann, Jr. |
| 5,933,421 | A | 8/1999 | Alamouti et al. |
| 5,949,814 | A | 9/1999 | Odenwalder et al. |
| 5,953,325 | A | 9/1999 | Willars |
| 5,955,992 | A | 9/1999 | Shattil |
| 5,956,642 | A | 9/1999 | Larsson et al. |
| 5,995,992 | A | 11/1999 | Eckard |
| 5,999,826 | A | 12/1999 | Whinnett |
| 6,002,942 | A | 12/1999 | Park |
| 6,016,123 | A | 1/2000 | Barton et al. |
| 6,038,263 | A | 3/2000 | Kotzin et al. |
| 6,038,450 | A | 3/2000 | Brink et al. |
| 6,052,364 | A | 4/2000 | Chalmers et al. |
| 6,061,337 | A | 5/2000 | Light et al. |
| 6,067,315 | A | 5/2000 | Sandin |
| 6,075,350 | A | 6/2000 | Peng |
| 6,075,797 | A | 6/2000 | Thomas |
| 6,076,114 | A | 6/2000 | Wesley |
| 6,088,345 | A | 7/2000 | Sakoda et al. |
| 6,108,323 | A | 8/2000 | Gray |
| 6,108,550 | A | 8/2000 | Wiorek et al. |
| 6,112,094 | A | 8/2000 | Dent |
| 6,128,776 | A | 10/2000 | Kang |
| 6,138,037 | A | 10/2000 | Jaamies |
| 6,141,317 | A | 10/2000 | Marchok et al. |
| 6,154,484 | A | 11/2000 | Lee et al. |
| 6,169,910 | B1 | 1/2001 | Tamil et al. |
| 6,175,550 | B1 | 1/2001 | Van Nee |
| 6,175,650 | B1 | 1/2001 | Sindhu et al. |
| 6,176,550 | B1 | 1/2001 | Lamart et al. |
| 6,198,775 | B1 | 3/2001 | Khayrallah et al. |
| 6,215,983 | B1 | 4/2001 | Dogan et al. |
| 6,226,280 | B1 | 5/2001 | Roark et al. |
| 6,232,918 | B1 | 5/2001 | Wax et al. |
| 6,240,129 | B1 | 5/2001 | Reusens et al. |
| 6,249,683 | B1 | 6/2001 | Lundby et al. |
| 6,256,478 | B1 | 7/2001 | Allen et al. |
| 6,271,946 | B1 | 8/2001 | Chang et al. |
| 6,272,122 | B1 | 8/2001 | Wee |
| 6,310,704 | B1 | 10/2001 | Dogan et al. |
| 6,317,435 | B1 | 11/2001 | Tiedemann, Jr. et al. |
| 6,335,922 | B1 | 1/2002 | Tiedemann, Jr. et al. |
| 6,337,659 | B1 | 1/2002 | Kim |
| 6,337,983 | B1 | 1/2002 | Bonta et al. |
| 6,353,637 | B1 | 3/2002 | Mansour et al. |
| 6,363,060 | B1 | 3/2002 | Sarkar |
| 6,374,115 | B1 | 4/2002 | Barnes et al. |
| 6,377,539 | B1 | 4/2002 | Kang et al. |
| 6,377,809 | B1 | 4/2002 | Rezaiifar et al. |
| 6,388,998 | B1 | 5/2002 | Kasturia |
| 6,393,008 | B1 | 5/2002 | Cheng et al. |
| 6,393,012 | B1 | 5/2002 | Pankaj |
| 6,401,062 | B1 | 6/2002 | Murashima |
| 6,438,369 | B1 | 8/2002 | Huang et al. |
| 6,449,246 | B1 | 9/2002 | Barton et al. |
| 6,466,800 | B1 | 10/2002 | Sydon et al. |
| 6,473,467 | B1 | 10/2002 | Wallace et al. |
| 6,477,317 | B1 | 11/2002 | Itokawa |
| 6,478,422 | B1 | 11/2002 | Hansen |
| 6,483,820 | B1 | 11/2002 | Davidson et al. |
| 6,487,243 | B1 | 11/2002 | Hwang et al. |
| 6,496,790 | B1 | 12/2002 | Kathavate et al. |
| 6,501,810 | B1 | 12/2002 | Karim et al. |
| 6,507,601 | B2 | 1/2003 | Parsa et al. |
| 6,519,462 | B1 | 2/2003 | Lu et al. |
| 6,529,525 | B1 | 3/2003 | Pecen et al. |
| 6,535,666 | B1 | 3/2003 | Dogan et al. |
| 6,539,008 | B1 | 3/2003 | Ahn et al. |
| 6,539,213 | B1 | 3/2003 | Richards et al. |
| 6,542,485 | B1 | 4/2003 | Mujtaba |
| 6,542,743 | B1 | 4/2003 | Soliman |
| 6,563,806 | B1 | 5/2003 | Yano et al. |
| 6,563,881 | B1 | 5/2003 | Sakoda et al. |
| 6,577,739 | B1 | 6/2003 | Hurtig et al. |
| 6,584,140 | B1 | 6/2003 | Lee |
| 6,590,881 | B1 | 7/2003 | Wallace et al. |
| 6,597,746 | B1 | 7/2003 | Amrany et al. |
| 6,601,206 | B1 | 7/2003 | Marvasti |
| 6,614,857 | B1 | 9/2003 | Buehrer et al. |
| 6,625,172 | B2 | 9/2003 | Odenwalder et al. |
| 6,636,568 | B2 | 10/2003 | Kadous |
| 6,654,339 | B1 | 11/2003 | Bohnke et al. |
| 6,654,431 | B1 | 11/2003 | Barton et al. |
| 6,657,949 | B1 | 12/2003 | Jones, IV et al. |
| 6,658,258 | B1 | 12/2003 | Chen et al. |
| 6,674,787 | B1 | 1/2004 | Dick et al. |
| 6,674,810 | B1 | 1/2004 | Cheng |
| 6,675,012 | B2 | 1/2004 | Gray |
| 6,678,318 | B1 | 1/2004 | Lai |
| 6,690,951 | B1 | 2/2004 | Cuffaro et al. |
| 6,693,952 | B1 | 2/2004 | Chuah et al. |
| 6,701,165 | B1 | 3/2004 | Ho et al. |
| 6,704,571 | B1 | 3/2004 | Moon |
| 6,711,400 | B1 | 3/2004 | Aura |
| 6,717,908 | B2 | 4/2004 | Vijayan et al. |
| 6,721,568 | B1 | 4/2004 | Gustavsson et al. |
| 6,724,719 | B1 | 4/2004 | Tong et al. |
| 6,731,602 | B1 | 5/2004 | Watanabe et al. |
| 6,735,244 | B1 | 5/2004 | Hasegawa et al. |
| 6,744,743 | B2 | 6/2004 | Walton et al. |
| 6,748,220 | B1 | 6/2004 | Chow et al. |
| 6,751,444 | B1 | 6/2004 | Meiyappan |
| 6,751,456 | B2 | 6/2004 | Bilgic |
| 6,754,511 | B1 | 6/2004 | Halford et al. |
| 6,763,009 | B1 | 7/2004 | Bedekar et al. |
| 6,765,969 | B1 | 7/2004 | Vook et al. |
| 6,776,165 | B2 | 8/2004 | Jin |
| 6,776,765 | B2 | 8/2004 | Soukup et al. |
| 6,778,513 | B2 | 8/2004 | Kasapi et al. |
| 6,785,341 | B2 | 8/2004 | Walton et al. |
| 6,798,736 | B1 | 9/2004 | Black et al. |
| 6,799,043 | B2 | 9/2004 | Tiedemann, Jr. et al. |
| 6,802,035 | B2 | 10/2004 | Catreux et al. |
| 6,813,284 | B2 | 11/2004 | Vayanos et al. |
| 6,821,535 | B2 | 11/2004 | Nurmi et al. |
| 6,828,293 | B1 | 12/2004 | Hazenkamp et al. |
| 6,829,293 | B2 | 12/2004 | Jones et al. |
| 6,831,943 | B1 | 12/2004 | Dabak et al. |
| 6,842,487 | B1 | 1/2005 | Larsson |
| 6,850,481 | B2 | 2/2005 | Wu et al. |
| 6,850,509 | B2 | 2/2005 | Lee et al. |
| 6,862,271 | B2 | 3/2005 | Medvedev et al. |
| 6,870,808 | B1 | 3/2005 | Liu et al. |
| 6,870,826 | B1 | 3/2005 | Ishizu |
| 6,904,097 | B2 | 6/2005 | Agami et al. |

| | | | |
|---|---|---|---|
| 6,904,283 B2 | 6/2005 | Li et al. |
| 6,904,550 B2 | 6/2005 | Sibecas et al. |
| 6,907,020 B2 | 6/2005 | Periyalwar et al. |
| 6,907,269 B2 | 6/2005 | Yamaguchi et al. |
| 6,909,707 B2 | 6/2005 | Rotstein et al. |
| 6,917,602 B2 | 7/2005 | Toskala et al. |
| 6,917,821 B2 | 7/2005 | Kadous et al. |
| 6,927,728 B2 | 8/2005 | Vook et al. |
| 6,928,047 B1 | 8/2005 | Xia |
| 6,934,266 B2 | 8/2005 | Dulin et al. |
| 6,934,275 B1 | 8/2005 | Love et al. |
| 6,934,340 B1 | 8/2005 | Dollard |
| 6,940,842 B2 | 9/2005 | Proctor, Jr. |
| 6,940,845 B2 | 9/2005 | Benveniste |
| 6,954,448 B2 | 10/2005 | Farley et al. |
| 6,954,481 B1 | 10/2005 | Laroia et al. |
| 6,954,622 B2 | 10/2005 | Nelson et al. |
| 6,961,364 B1 | 11/2005 | Laroia et al. |
| 6,963,543 B2 | 11/2005 | Diep et al. |
| 6,970,682 B2 | 11/2005 | Crilly, Jr. et al. |
| 6,975,868 B2 | 12/2005 | Joshi et al. |
| 6,980,540 B1 | 12/2005 | Laroia et al. |
| 6,985,434 B2 | 1/2006 | Wu et al. |
| 6,985,453 B2 | 1/2006 | Lundby et al. |
| 6,985,466 B1 | 1/2006 | Yun et al. |
| 6,985,498 B2 | 1/2006 | Laroia et al. |
| 6,987,746 B1 | 1/2006 | Song |
| 6,993,342 B2 | 1/2006 | Kuchibhotla et al. |
| 7,002,900 B2 | 2/2006 | Walton et al. |
| 7,006,529 B2 | 2/2006 | Alastalo et al. |
| 7,006,557 B2 | 2/2006 | Subrahmanya et al. |
| 7,006,848 B2 | 2/2006 | Ling et al. |
| 7,009,500 B2 | 3/2006 | Rao et al. |
| 7,010,048 B1 | 3/2006 | Shattil |
| 7,013,143 B2 | 3/2006 | Love et al. |
| 7,016,318 B2 | 3/2006 | Pankaj et al. |
| 7,016,319 B2 | 3/2006 | Baum et al. |
| 7,016,425 B1 | 3/2006 | Kraiem |
| 7,020,110 B2 | 3/2006 | Walton et al. |
| 7,039,356 B2 | 5/2006 | Nguyen |
| 7,039,370 B2 | 5/2006 | Laroia et al. |
| 7,042,857 B2 | 5/2006 | Krishnan et al. |
| 7,047,006 B2 | 5/2006 | Classon et al. |
| 7,050,402 B2 | 5/2006 | Schmidl et al. |
| 7,050,759 B2 | 5/2006 | Gaal et al. |
| 7,054,301 B1 | 5/2006 | Sousa et al. |
| 7,061,898 B2 | 6/2006 | Hashem et al. |
| 7,069,009 B2 | 6/2006 | Li et al. |
| 7,072,315 B1 | 7/2006 | Liu et al. |
| 7,079,867 B2 | 7/2006 | Chun et al. |
| 7,085,574 B2 | 8/2006 | Gaal et al. |
| 7,095,708 B1 | 8/2006 | Alamouti et al. |
| 7,099,299 B2 | 8/2006 | Liang et al. |
| 7,099,630 B2 | 8/2006 | Brunner et al. |
| 7,103,384 B2 | 9/2006 | Chun |
| 7,106,319 B2 | 9/2006 | Ishiyama |
| 7,113,808 B2 | 9/2006 | Hwang et al. |
| 7,120,134 B2 | 10/2006 | Tiedemann, Jr. et al. |
| 7,120,395 B2 | 10/2006 | Tong et al. |
| 7,126,928 B2 | 10/2006 | Tiedemann, Jr. et al. |
| 7,131,086 B2 | 10/2006 | Yamasaki et al. |
| 7,133,460 B2 | 11/2006 | Bae et al. |
| 7,139,328 B2 | 11/2006 | Thomas et al. |
| 7,142,864 B2 | 11/2006 | Laroia et al. |
| 7,145,959 B2 | 12/2006 | Harel et al. |
| 7,149,199 B2 | 12/2006 | Sung et al. |
| 7,149,238 B2 | 12/2006 | Agee et al. |
| 7,151,761 B1 | 12/2006 | Palenius |
| 7,151,936 B2 | 12/2006 | Wager et al. |
| 7,154,936 B2 | 12/2006 | Bjerke et al. |
| 7,155,236 B2 | 12/2006 | Chen et al. |
| 7,157,351 B2 | 1/2007 | Cheng et al. |
| 7,161,971 B2 | 1/2007 | Tiedemann, Jr. et al. |
| 7,164,649 B2 | 1/2007 | Walton et al. |
| 7,164,696 B2 | 1/2007 | Sano et al. |
| 7,167,916 B2 | 1/2007 | Willen et al. |
| 7,170,937 B2 | 1/2007 | Zhou |
| 7,177,297 B2 | 2/2007 | Agrawal et al. |
| 7,180,627 B2 | 2/2007 | Moylan et al. |
| 7,181,170 B2 | 2/2007 | Love et al. |
| 7,184,426 B2 | 2/2007 | Padovani et al. |
| 7,184,713 B2 | 2/2007 | Kadous et al. |
| 7,188,300 B2 | 3/2007 | Eriksson et al. |
| 7,197,282 B2 | 3/2007 | Dent et al. |
| 7,200,177 B2 | 4/2007 | Miyoshi |
| 7,209,712 B2 | 4/2007 | Holtzman |
| 7,215,979 B2 | 5/2007 | Nakagawa et al. |
| 7,230,942 B2 | 6/2007 | Laroia et al. |
| 7,233,634 B1 * | 6/2007 | Hassell Sweatman et al. ............. 375/346 |
| 7,236,747 B1 | 6/2007 | Meacham et al. |
| 7,242,722 B2 | 7/2007 | Krauss et al. |
| 7,243,150 B2 | 7/2007 | Sher et al. |
| 7,248,559 B2 | 7/2007 | Ma et al. |
| 7,248,841 B2 | 7/2007 | Agee et al. |
| 7,254,158 B2 | 8/2007 | Agrawal |
| 7,257,167 B2 | 8/2007 | Lau |
| 7,257,406 B2 | 8/2007 | Ji |
| 7,257,423 B2 | 8/2007 | Iochi |
| 7,260,153 B2 | 8/2007 | Nissani et al. |
| 7,280,467 B2 | 10/2007 | Smee et al. |
| 7,289,570 B2 | 10/2007 | Schmidl et al. |
| 7,289,585 B2 | 10/2007 | Sandhu et al. |
| 7,290,195 B2 | 10/2007 | Guo et al. |
| 7,292,651 B2 | 11/2007 | Ling et al. |
| 7,292,863 B2 | 11/2007 | Chen et al. |
| 7,295,509 B2 | 11/2007 | Laroia et al. |
| 7,313,086 B2 | 12/2007 | Aizawa |
| 7,313,126 B2 | 12/2007 | Yun et al. |
| 7,313,174 B2 | 12/2007 | Alard et al. |
| 7,313,407 B2 | 12/2007 | Shapira |
| 7,327,812 B2 | 2/2008 | Auer |
| 7,330,701 B2 | 2/2008 | Mukkavilli et al. |
| 7,336,727 B2 | 2/2008 | Mukkavilli et al. |
| 7,349,371 B2 | 3/2008 | Schein et al. |
| 7,349,667 B2 | 3/2008 | Magee et al. |
| 7,356,000 B2 | 4/2008 | Oprescu-Surcobe et al. |
| 7,356,005 B2 | 4/2008 | Derryberry et al. |
| 7,356,073 B2 * | 4/2008 | Heikkila ............. 375/148 |
| 7,359,327 B2 | 4/2008 | Oshiba |
| 7,363,055 B2 | 4/2008 | Castrogiovanni et al. |
| 7,366,223 B1 | 4/2008 | Chen et al. |
| 7,366,253 B2 | 4/2008 | Kim et al. |
| 7,366,520 B2 | 4/2008 | Haustein et al. |
| 7,369,531 B2 | 5/2008 | Cho et al. |
| 7,372,911 B1 | 5/2008 | Lindskog et al. |
| 7,372,912 B2 | 5/2008 | Seo et al. |
| 7,379,489 B2 | 5/2008 | Zuniga et al. |
| 7,382,764 B2 | 6/2008 | Uehara |
| 7,392,014 B2 | 6/2008 | Baker et al. |
| 7,394,865 B2 | 7/2008 | Borran et al. |
| 7,403,745 B2 | 7/2008 | Dominique et al. |
| 7,403,748 B1 | 7/2008 | Keskitalo et al. |
| 7,406,119 B2 | 7/2008 | Yamano et al. |
| 7,406,336 B2 | 7/2008 | Astely et al. |
| 7,411,898 B2 | 8/2008 | Erlich et al. |
| 7,412,212 B2 | 8/2008 | Hottinen |
| 7,418,043 B2 | 8/2008 | Shattil |
| 7,418,246 B2 | 8/2008 | Kim et al. |
| 7,423,991 B2 | 9/2008 | Cho et al. |
| 7,426,426 B2 | 9/2008 | Van Baren |
| 7,428,426 B2 | 9/2008 | Kiran et al. |
| 7,433,661 B2 | 10/2008 | Kogiantis et al. |
| 7,437,164 B2 | 10/2008 | Agrawal et al. |
| 7,443,835 B2 | 10/2008 | Lakshmi Narayanan et al. |
| 7,447,270 B1 | 11/2008 | Hottinen |
| 7,450,548 B2 | 11/2008 | Haustein et al. |
| 7,460,466 B2 | 12/2008 | Lee et al. |
| 7,463,698 B2 | 12/2008 | Fujii et al. |
| 7,468,943 B2 | 12/2008 | Gu et al. |
| 7,469,011 B2 | 12/2008 | Lin et al. |
| 7,471,963 B2 | 12/2008 | Kim et al. |
| 7,483,408 B2 | 1/2009 | Bevan et al. |
| 7,483,719 B2 | 1/2009 | Kim et al. |
| 7,486,735 B2 | 2/2009 | Dubuc et al. |
| 7,492,788 B2 | 2/2009 | Zhang et al. |
| 7,499,393 B2 | 3/2009 | Ozluturk |
| 7,508,842 B2 | 3/2009 | Baum et al. |

| Patent/Publication | Date | Inventor |
|---|---|---|
| 7,512,096 B2 | 3/2009 | Kuzminskiy et al. |
| 7,548,506 B2 | 6/2009 | Ma et al. |
| 7,551,546 B2 | 6/2009 | Ma et al. |
| 7,551,564 B2 | 6/2009 | Mattina |
| 7,558,293 B2 | 7/2009 | Choi et al. |
| 7,567,621 B2 | 7/2009 | Sampath et al. |
| 7,573,900 B2 | 8/2009 | Kim et al. |
| 7,599,327 B2 | 10/2009 | Zhuang |
| 7,616,955 B2 | 11/2009 | Kim |
| 7,623,442 B2 | 11/2009 | Laroia et al. |
| 7,627,051 B2 | 12/2009 | Shen et al. |
| 7,664,061 B2 | 2/2010 | Hottinen |
| 7,676,007 B1 | 3/2010 | Choi et al. |
| 7,684,507 B2 | 3/2010 | Levy |
| 7,724,777 B2 | 5/2010 | Sutivong et al. |
| 7,768,979 B2 | 8/2010 | Sutivong et al. |
| 7,916,624 B2 | 3/2011 | Laroia et al. |
| 7,924,699 B2 | 4/2011 | Laroia et al. |
| 7,990,843 B2 | 8/2011 | Laroia et al. |
| 7,990,844 B2 | 8/2011 | Laroia et al. |
| 8,045,512 B2 | 10/2011 | Khandekar et al. |
| 8,095,141 B2 | 1/2012 | Teague |
| 8,098,568 B2 | 1/2012 | Laroia et al. |
| 8,098,569 B2 | 1/2012 | Laroia et al. |
| 8,199,634 B2 | 6/2012 | Laroia et al. |
| 8,218,425 B2 | 7/2012 | Laroia et al. |
| 8,223,627 B2 | 7/2012 | Laroia et al. |
| 2001/0024427 A1 | 9/2001 | Suzuki |
| 2001/0030948 A1 | 10/2001 | Tiedemann, Jr. |
| 2001/0055294 A1 | 12/2001 | Motoyoshi |
| 2002/0015405 A1 | 2/2002 | Sepponen et al. |
| 2002/0018157 A1 | 2/2002 | Zhang et al. |
| 2002/0044524 A1 | 4/2002 | Laroia et al. |
| 2002/0061742 A1 | 5/2002 | Lapaille et al. |
| 2002/0077152 A1 | 6/2002 | Johnson et al. |
| 2002/0085521 A1 | 7/2002 | Tripathi et al. |
| 2002/0090004 A1 | 7/2002 | Rinchiuso |
| 2002/0090024 A1 | 7/2002 | Tan |
| 2002/0128035 A1 | 9/2002 | Jokinen et al. |
| 2002/0159422 A1 | 10/2002 | Li et al. |
| 2002/0160781 A1 | 10/2002 | Bark et al. |
| 2002/0168946 A1 | 11/2002 | Aizawa et al. |
| 2002/0172293 A1 | 11/2002 | Kuchi et al. |
| 2002/0176398 A1 | 11/2002 | Nidda |
| 2003/0002464 A1 | 1/2003 | Rezaiifar et al. |
| 2003/0035491 A1 | 2/2003 | Walton et al. |
| 2003/0040283 A1 | 2/2003 | Kawai et al. |
| 2003/0043732 A1 | 3/2003 | Walton et al. |
| 2003/0043764 A1 | 3/2003 | Kim et al. |
| 2003/0063579 A1 | 4/2003 | Lee |
| 2003/0068983 A1 | 4/2003 | Kim et al. |
| 2003/0072280 A1 | 4/2003 | McFarland et al. |
| 2003/0072395 A1 | 4/2003 | Jia et al. |
| 2003/0073409 A1 | 4/2003 | Nobukiyo et al. |
| 2003/0076890 A1* | 4/2003 | Hochwald et al. |
| 2003/0086393 A1 | 5/2003 | Vasudevan et al. |
| 2003/0096579 A1 | 5/2003 | Ito et al. |
| 2003/0103520 A1 | 6/2003 | Chen et al. |
| 2003/0112745 A1 | 6/2003 | Zhuang et al. |
| 2003/0125040 A1 | 7/2003 | Walton et al. |
| 2003/0142648 A1 | 7/2003 | Semper |
| 2003/0147371 A1 | 8/2003 | Choi et al. |
| 2003/0181170 A1 | 9/2003 | Sim |
| 2003/0185310 A1 | 10/2003 | Ketchum et al. |
| 2003/0190897 A1 | 10/2003 | Lei et al. |
| 2003/0193915 A1 | 10/2003 | Lee et al. |
| 2003/0202491 A1 | 10/2003 | Tiedemann, Jr. et al. |
| 2003/0228850 A1 | 12/2003 | Hwang |
| 2003/0235255 A1 | 12/2003 | Ketchum et al. |
| 2004/0002364 A1 | 1/2004 | Trikkonen et al. |
| 2004/0015692 A1 | 1/2004 | Green et al. |
| 2004/0017785 A1 | 1/2004 | Zelst |
| 2004/0037235 A1 | 2/2004 | Kadous |
| 2004/0038697 A1 | 2/2004 | Attar et al. |
| 2004/0048609 A1 | 3/2004 | Kosaka |
| 2004/0058687 A1 | 3/2004 | Kim et al. |
| 2004/0066761 A1 | 4/2004 | Giannakis et al. |
| 2004/0072565 A1 | 4/2004 | Nobukiyo et al. |
| 2004/0077379 A1 | 4/2004 | Smith et al. |
| 2004/0087325 A1 | 5/2004 | Cheng et al. |
| 2004/0097215 A1 | 5/2004 | Abe et al. |
| 2004/0098505 A1 | 5/2004 | Clemmensen |
| 2004/0105489 A1 | 6/2004 | Kim et al. |
| 2004/0114618 A1 | 6/2004 | Tong et al. |
| 2004/0120411 A1 | 6/2004 | Walton et al. |
| 2004/0136344 A1 | 7/2004 | Kim et al. |
| 2004/0136349 A1 | 7/2004 | Walton et al. |
| 2004/0156328 A1 | 8/2004 | Walton et al. |
| 2004/0160914 A1 | 8/2004 | Sarkar |
| 2004/0160933 A1 | 8/2004 | Odenwalder et al. |
| 2004/0166867 A1 | 8/2004 | Hawe |
| 2004/0166887 A1 | 8/2004 | Laroia et al. |
| 2004/0170152 A1 | 9/2004 | Nagao et al. |
| 2004/0170157 A1 | 9/2004 | Kim et al. |
| 2004/0171384 A1 | 9/2004 | Holma et al. |
| 2004/0179627 A1 | 9/2004 | Ketchum et al. |
| 2004/0185792 A1 | 9/2004 | Alexiou et al. |
| 2004/0202257 A1 | 10/2004 | Mehta et al. |
| 2004/0208138 A1 | 10/2004 | Hayashi et al. |
| 2004/0219819 A1 | 11/2004 | Di Mascio |
| 2004/0219919 A1 | 11/2004 | Whinnett et al. |
| 2004/0224711 A1 | 11/2004 | Panchal et al. |
| 2004/0228313 A1 | 11/2004 | Cheng et al. |
| 2004/0240419 A1 | 12/2004 | Abrishamkar et al. |
| 2004/0240572 A1 | 12/2004 | Brutel et al. |
| 2004/0248604 A1 | 12/2004 | Vaidyanathan |
| 2004/0252529 A1 | 12/2004 | Huber et al. |
| 2004/0252629 A1 | 12/2004 | Hasegawa et al. |
| 2004/0252655 A1 | 12/2004 | Lim et al. |
| 2004/0252662 A1 | 12/2004 | Cho |
| 2004/0257979 A1 | 12/2004 | Ro et al. |
| 2004/0264507 A1 | 12/2004 | Cho et al. |
| 2005/0002412 A1 | 1/2005 | Sagfors et al. |
| 2005/0002440 A1 | 1/2005 | Alamouti et al. |
| 2005/0002468 A1 | 1/2005 | Walton et al. |
| 2005/0003782 A1 | 1/2005 | Wintzell |
| 2005/0008091 A1* | 1/2005 | Boutros et al. |
| 2005/0009486 A1 | 1/2005 | Al-Dhahir et al. |
| 2005/0013263 A1 | 1/2005 | Kim et al. |
| 2005/0030886 A1 | 2/2005 | Wu et al. |
| 2005/0034079 A1 | 2/2005 | Gunasekar et al. |
| 2005/0041611 A1 | 2/2005 | Sandhu |
| 2005/0041618 A1 | 2/2005 | Wei et al. |
| 2005/0041775 A1 | 2/2005 | Batzinger et al. |
| 2005/0044206 A1 | 2/2005 | Johansson et al. |
| 2005/0047517 A1 | 3/2005 | Georgios et al. |
| 2005/0052991 A1 | 3/2005 | Kadous |
| 2005/0053081 A1 | 3/2005 | Andersson et al. |
| 2005/0063298 A1 | 3/2005 | Ling et al. |
| 2005/0073976 A1 | 4/2005 | Fujii |
| 2005/0084000 A1 | 4/2005 | Krauss et al. |
| 2005/0085197 A1 | 4/2005 | Laroia et al. |
| 2005/0085236 A1 | 4/2005 | Gerlach et al. |
| 2005/0088959 A1 | 4/2005 | Kadous |
| 2005/0111397 A1 | 5/2005 | Attar et al. |
| 2005/0122898 A1 | 6/2005 | Jang et al. |
| 2005/0135324 A1 | 6/2005 | Kim et al. |
| 2005/0135498 A1* | 6/2005 | Yee |
| 2005/0141624 A1 | 6/2005 | Lakshmipathi et al. |
| 2005/0147024 A1 | 7/2005 | Jung et al. |
| 2005/0157807 A1 | 7/2005 | Shim et al. |
| 2005/0159162 A1 | 7/2005 | Park |
| 2005/0164709 A1 | 7/2005 | Balasubramanian et al. |
| 2005/0165949 A1 | 7/2005 | Teague |
| 2005/0174981 A1 | 8/2005 | Heath et al. |
| 2005/0175070 A1 | 8/2005 | Grob et al. |
| 2005/0180311 A1 | 8/2005 | Wang et al. |
| 2005/0180313 A1 | 8/2005 | Kim et al. |
| 2005/0192011 A1 | 9/2005 | Hong et al. |
| 2005/0195852 A1 | 9/2005 | Vayanos et al. |
| 2005/0195886 A1 | 9/2005 | Lampinen et al. |
| 2005/0201296 A1 | 9/2005 | Vannithamby et al. |
| 2005/0207367 A1 | 9/2005 | Onggosanusi et al. |
| 2005/0239465 A1 | 10/2005 | Lee et al. |
| 2005/0243791 A1 | 11/2005 | Park et al. |
| 2005/0246548 A1 | 11/2005 | Laitinen |
| 2005/0249266 A1 | 11/2005 | Brown et al. |
| 2005/0254467 A1 | 11/2005 | Li et al. |

| | | | | | | |
|---|---|---|---|---|---|---|
| 2005/0254477 A1 | 11/2005 | Lee et al. | | 2007/0041457 A1 | 2/2007 | Kadous et al. |
| 2005/0254556 A1 | 11/2005 | Fujii et al. | | 2007/0047485 A1 | 3/2007 | Gorokhov et al. |
| 2005/0259005 A1 | 11/2005 | Chiang et al. | | 2007/0047495 A1 | 3/2007 | Ji et al. |
| 2005/0259723 A1 | 11/2005 | Blanchard | | 2007/0049218 A1 | 3/2007 | Gorokhov et al. |
| 2005/0259757 A1 | 11/2005 | Wu et al. | | 2007/0053282 A1 | 3/2007 | Tong et al. |
| 2005/0265293 A1 | 12/2005 | Ro et al. | | 2007/0053383 A1 | 3/2007 | Choi et al. |
| 2005/0276347 A1 | 12/2005 | Mujtaba et al. | | 2007/0060178 A1 | 3/2007 | Gorokhov et al. |
| 2005/0276348 A1 | 12/2005 | Vandenameele | | 2007/0064669 A1 | 3/2007 | Classon et al. |
| 2005/0277423 A1 | 12/2005 | Sandhu et al. | | 2007/0071147 A1 | 3/2007 | Sampath et al. |
| 2005/0281290 A1 | 12/2005 | Khandekar et al. | | 2007/0097853 A1 | 5/2007 | Khandekar et al. |
| 2005/0282500 A1 | 12/2005 | Wang et al. | | 2007/0097889 A1 | 5/2007 | Wang et al. |
| 2005/0286408 A1 | 12/2005 | Jin et al. | | 2007/0097897 A1 | 5/2007 | Teague et al. |
| 2005/0289256 A1 | 12/2005 | Cudak et al. | | 2007/0097908 A1 | 5/2007 | Khandekar et al. |
| 2006/0002451 A1 | 1/2006 | Fukuta et al. | | 2007/0097909 A1 | 5/2007 | Khandekar et al. |
| 2006/0013285 A1 | 1/2006 | Kobayashi et al. | | 2007/0097910 A1 | 5/2007 | Ji et al. |
| 2006/0018336 A1 | 1/2006 | Sutivong et al. | | 2007/0097922 A1 | 5/2007 | Parekh et al. |
| 2006/0018347 A1 | 1/2006 | Agrawal | | 2007/0097927 A1 | 5/2007 | Gorokhov et al. |
| 2006/0018397 A1 | 1/2006 | Sampath et al. | | 2007/0097942 A1 | 5/2007 | Gorokhov et al. |
| 2006/0026344 A1 | 2/2006 | Sun Hsu et al. | | 2007/0097981 A1 | 5/2007 | Papasakellariou |
| 2006/0029289 A1 | 2/2006 | Yamaguchi et al. | | 2007/0098050 A1 | 5/2007 | Khandekar et al. |
| 2006/0034163 A1 | 2/2006 | Gore et al. | | 2007/0098120 A1 | 5/2007 | Wang |
| 2006/0034173 A1 | 2/2006 | Teague et al. | | 2007/0110172 A1 | 5/2007 | Faulkner et al. |
| 2006/0039332 A1 | 2/2006 | Kotzin | | 2007/0115795 A1 | 5/2007 | Gore et al. |
| 2006/0039344 A1 | 2/2006 | Khan | | 2007/0149194 A1 | 6/2007 | Das et al. |
| 2006/0040655 A1 | 2/2006 | Kim | | 2007/0149228 A1 | 6/2007 | Das |
| 2006/0050770 A1 | 3/2006 | Wallace et al. | | 2007/0159969 A1 | 7/2007 | Das et al. |
| 2006/0056340 A1 | 3/2006 | Hottinen et al. | | 2007/0160115 A1 | 7/2007 | Palanki et al. |
| 2006/0057958 A1 | 3/2006 | Ngo et al. | | 2007/0165738 A1 | 7/2007 | Barriac et al. |
| 2006/0067421 A1 | 3/2006 | Walton et al. | | 2007/0177631 A1 | 8/2007 | Popovic et al. |
| 2006/0078075 A1 | 4/2006 | Stamoulis et al. | | 2007/0177681 A1 | 8/2007 | Choi et al. |
| 2006/0083159 A1 | 4/2006 | Laroia et al. | | 2007/0183303 A1 | 8/2007 | Pi et al. |
| 2006/0083183 A1 | 4/2006 | Teague et al. | | 2007/0183386 A1 | 8/2007 | Muharemovic et al. |
| 2006/0092054 A1 | 5/2006 | Li et al. | | 2007/0207812 A1 | 9/2007 | Borran et al. |
| 2006/0104333 A1 | 5/2006 | Rainbolt et al. | | 2007/0211616 A1 | 9/2007 | Khandekar et al. |
| 2006/0104381 A1 | 5/2006 | Menon et al. | | 2007/0211667 A1 | 9/2007 | Agrawal et al. |
| 2006/0111054 A1 | 5/2006 | Pan et al. | | 2007/0230324 A1 | 10/2007 | Li et al. |
| 2006/0114858 A1 | 6/2006 | Walton et al. | | 2007/0242653 A1 | 10/2007 | Yang et al. |
| 2006/0120469 A1 | 6/2006 | Maltsev et al. | | 2007/0263743 A1 | 11/2007 | Lee et al. |
| 2006/0120471 A1 | 6/2006 | Learned et al. | | 2007/0280336 A1 | 12/2007 | Zhang et al. |
| 2006/0126491 A1 | 6/2006 | Ro et al. | | 2007/0281702 A1 | 12/2007 | Lim et al. |
| 2006/0133269 A1 | 6/2006 | Prakash et al. | | 2008/0039129 A1 | 2/2008 | Li et al. |
| 2006/0133455 A1 | 6/2006 | Agrawal et al. | | 2008/0063099 A1 | 3/2008 | Laroia et al. |
| 2006/0133521 A1 | 6/2006 | Sampath et al. | | 2008/0095223 A1 | 4/2008 | Tong et al. |
| 2006/0140289 A1 | 6/2006 | Mandyam et al. | | 2008/0095262 A1 | 4/2008 | Ho et al. |
| 2006/0146867 A1 | 7/2006 | Lee et al. | | 2008/0151829 A1 | 6/2008 | Khandekar et al. |
| 2006/0153239 A1 | 7/2006 | Julian et al. | | 2008/0181139 A1 | 7/2008 | Rangarajan et al. |
| 2006/0155534 A1 | 7/2006 | Lin et al. | | 2008/0214222 A1 | 9/2008 | Atarashi et al. |
| 2006/0156199 A1 | 7/2006 | Palanki et al. | | 2008/0253279 A1 | 10/2008 | Ma et al. |
| 2006/0172704 A1 | 8/2006 | Nishio et al. | | 2008/0267157 A1 | 10/2008 | Lee et al. |
| 2006/0189321 A1 | 8/2006 | Oh et al. | | 2008/0299983 A1 | 12/2008 | Kwak et al. |
| 2006/0193294 A1 | 8/2006 | Jorswieck et al. | | 2009/0003466 A1 | 1/2009 | Taherzadehboroujeni et al. |
| 2006/0203708 A1 | 9/2006 | Sampath et al. | | 2009/0010351 A1 | 1/2009 | Laroia et al. |
| 2006/0203794 A1 | 9/2006 | Sampath et al. | | 2009/0022098 A1 | 1/2009 | Novak et al. |
| 2006/0203891 A1 | 9/2006 | Sampath et al. | | 2009/0041150 A1 | 2/2009 | Tsai et al. |
| 2006/0203932 A1 | 9/2006 | Palanki et al. | | 2009/0110103 A1 | 4/2009 | Maltsev et al. |
| 2006/0209670 A1 | 9/2006 | Gorokhov et al. | | 2009/0180459 A1 | 7/2009 | Orlik et al. |
| 2006/0209732 A1 | 9/2006 | Gorokhov et al. | | 2009/0197646 A1 | 8/2009 | Tamura et al. |
| 2006/0209754 A1 | 9/2006 | Ji et al. | | 2009/0201826 A1 | 8/2009 | Gorokhov et al. |
| 2006/0209764 A1 | 9/2006 | Kim et al. | | 2009/0201872 A1 | 8/2009 | Gorokhov et al. |
| 2006/0209973 A1 | 9/2006 | Gorokhov et al. | | 2009/0213750 A1 | 8/2009 | Gorokhov et al. |
| 2006/0215777 A1 | 9/2006 | Krishnamoorthi | | 2009/0213950 A1 | 8/2009 | Gorokhov et al. |
| 2006/0218459 A1 | 9/2006 | Hedberg | | 2009/0262641 A1 | 10/2009 | Laroia et al. |
| 2006/0223449 A1 | 10/2006 | Sampath et al. | | 2009/0262699 A1 | 10/2009 | Wengerter et al. |
| 2006/0233124 A1 | 10/2006 | Palanki | | 2009/0285163 A1 | 11/2009 | Zhang et al. |
| 2006/0233131 A1 | 10/2006 | Gore et al. | | 2009/0287977 A1 | 11/2009 | Chang et al. |
| 2006/0270427 A1 | 11/2006 | Shida et al. | | 2010/0002570 A9 | 1/2010 | Walton et al. |
| 2006/0285485 A1 | 12/2006 | Agrawal et al. | | 2010/0135242 A1 | 6/2010 | Nam et al. |
| 2006/0285515 A1 | 12/2006 | Julian et al. | | 2010/0220800 A1 | 9/2010 | Erell et al. |
| 2006/0286974 A1 | 12/2006 | Gore et al. | | 2010/0232384 A1 | 9/2010 | Farajidana et al. |
| 2006/0286982 A1 | 12/2006 | Prakash et al. | | 2010/0238902 A1 | 9/2010 | Ji et al. |
| 2006/0286995 A1 | 12/2006 | Onggosanusi et al. | | 2010/0254263 A1 | 10/2010 | Chen et al. |
| 2006/0291371 A1 | 12/2006 | Sutivong et al. | | 2011/0064070 A1 | 3/2011 | Gore et al. |
| 2006/0292989 A1 | 12/2006 | Gerlach et al. | | 2011/0235733 A1 | 9/2011 | Laroia et al. |
| 2007/0004430 A1 | 1/2007 | Hyun et al. | | 2011/0235745 A1 | 9/2011 | Laroia et al. |
| 2007/0005749 A1 | 1/2007 | Sampath | | 2011/0235746 A1 | 9/2011 | Laroia et al. |
| 2007/0009011 A1 | 1/2007 | Coulson | | 2011/0235747 A1 | 9/2011 | Laroia et al. |
| 2007/0019596 A1 | 1/2007 | Barriac et al. | | 2011/0255518 A9 | 10/2011 | Agrawal et al. |
| 2007/0025345 A1 | 2/2007 | Bachl et al. | | 2011/0306291 A1 | 12/2011 | Ma et al. |
| 2007/0041404 A1 | 2/2007 | Palanki et al. | | 2012/0002623 A1 | 1/2012 | Khandekar et al. |

| | | | | | | |
|---|---|---|---|---|---|---|
| 2012/0063441 | A1 | 3/2012 | Palanki | EP | 1507421 A1 | 2/2005 |
| 2012/0120925 | A1 | 5/2012 | Kadous et al. | EP | 1513356 A2 | 3/2005 |
| 2012/0140798 | A1 | 6/2012 | Kadous et al. | EP | 1531575 A2 | 5/2005 |
| 2012/0140838 | A1 | 6/2012 | Kadous et al. | EP | 1533950 A1 | 5/2005 |

FOREIGN PATENT DOCUMENTS

| | | | | | |
|---|---|---|---|---|---|
| EP | 1538863 A1 | 6/2005 | JP | 2001249802 | 9/2001 |
| CA | 2477536 | 9/2003 | EP | 1542488 A1 | 6/2005 |
| CA | 2540688 | 5/2005 | EP | 1601149 A2 | 11/2005 |
| CA | 2577369 | 3/2006 | EP | 1643669 A1 | 4/2006 |
| CL | 19931400 | 12/1994 | EP | 1898542 A1 | 3/2008 |
| CL | 8461997 | 1/1998 | EP | 1941693 | 7/2011 |
| CL | 009531997 | 1/1998 | FR | 2584884 | 1/1987 |
| CL | 27102004 | 8/2005 | GB | 2279540 A | 1/1995 |
| CL | 22892004 | 9/2005 | GB | 2348776 A | 10/2000 |
| CL | 30862004 | 10/2005 | GB | 2412541 | 9/2005 |
| CL | 29932005 | 5/2006 | IL | 67573 | 2/2011 |
| CL | 15202006 | 12/2006 | IL | 201872 | 5/2012 |
| CL | 22032006 | 2/2007 | JP | 4301931 | 10/1992 |
| CL | 15212006 | 3/2007 | JP | 7336323 A | 12/1995 |
| CL | 14922006 | 4/2007 | JP | 8116329 A | 5/1996 |
| CL | 14892006 | 5/2007 | JP | 08288927 | 11/1996 |
| CL | 14902006 | 5/2007 | JP | 9008725 A | 1/1997 |
| CL | 29032006 | 5/2007 | JP | 9131342 | 5/1997 |
| CL | 29062006 | 5/2007 | JP | 9182148 A | 7/1997 |
| CL | 29042006 | 6/2007 | JP | 09214404 | 8/1997 |
| CL | 29022006 | 7/2007 | JP | 10117162 | 5/1998 |
| CL | 29082006 | 10/2007 | JP | 10322304 | 12/1998 |
| CL | 46.151 | 12/2009 | JP | 11191756 A | 7/1999 |
| CL | 29012006 | 1/2010 | JP | 11196109 | 7/1999 |
| CL | 29072006 | 1/2010 | JP | 11508417 T | 7/1999 |
| CN | 1252919 | 5/2000 | JP | 11239155 A | 8/1999 |
| CN | 1267437 | 9/2000 | JP | 11298954 | 10/1999 |
| CN | 1284795 | 2/2001 | JP | 11331927 A | 11/1999 |
| CN | 1296682 | 5/2001 | JP | 2000102065 A | 4/2000 |
| CN | 1344451 | 4/2002 | JP | 2000184425 | 6/2000 |
| CN | 1346221 | 4/2002 | JP | 2000511750 A | 9/2000 |
| CN | 1383631 | 12/2002 | JP | 2000332724 | 11/2000 |
| CN | 1386344 | 12/2002 | JP | 2001016644 A2 | 1/2001 |
| CN | 1520220 | 1/2003 | JP | 2001045573 A | 2/2001 |
| CN | 1402916 A | 3/2003 | JP | 2001057545 A | 2/2001 |
| CN | 1424835 | 6/2003 | JP | 2001156732 A | 6/2001 |
| CN | 1132474 C | 12/2003 | JP | 2001238269 | 8/2001 |
| CN | 1467938 A | 1/2004 | JP | 2001245355 A | 9/2001 |
| CN | 1487755 A | 4/2004 | JP | 2001521698 | 11/2001 |
| CN | 1525678 | 9/2004 | JP | 2001526012 | 12/2001 |
| CN | 1636346 | 7/2005 | JP | 2002026790 | 1/2002 |
| CN | 1642051 A | 7/2005 | JP | 2002515203 T | 5/2002 |
| CN | 1647436 A | 7/2005 | JP | 2002534925 A | 10/2002 |
| DE | 19800953 C1 | 7/1999 | JP | 2002534941 | 10/2002 |
| DE | 19957288 C1 | 5/2001 | JP | 2003032218 | 1/2003 |
| DE | 10240138 | 8/2003 | JP | 2003500909 | 1/2003 |
| DE | 10254384 | 6/2004 | JP | 200369472 | 3/2003 |
| EP | 0488976 | 6/1992 | JP | 2003101515 | 4/2003 |
| EP | 0568291 A2 | 11/1993 | JP | 2003169367 A | 6/2003 |
| EP | 0786889 A1 | 7/1997 | JP | 2003174426 | 6/2003 |
| EP | 0805576 A2 | 11/1997 | JP | 2003199173 A | 7/2003 |
| EP | 0807989 A1 | 11/1997 | JP | 2003520523 | 7/2003 |
| EP | 0844796 A2 | 5/1998 | JP | 2003249907 A | 9/2003 |
| EP | 0981222 A2 | 2/2000 | JP | 2003292667 A | 10/2003 |
| EP | 1001570 A2 | 5/2000 | JP | 2003347985 | 12/2003 |
| EP | 1047209 A1 | 10/2000 | JP | 2003348047 | 12/2003 |
| EP | 1061687 A1 | 12/2000 | JP | 2004007643 A | 1/2004 |
| EP | 1091516 A1 | 4/2001 | JP | 2004023716 | 1/2004 |
| EP | 1093241 A1 | 4/2001 | JP | 2004048716 | 2/2004 |
| EP | 1148673 A2 | 10/2001 | JP | 200472457 | 3/2004 |
| EP | 1180907 A2 | 2/2002 | JP | 2004072157 A | 3/2004 |
| EP | 1187506 A1 | 3/2002 | JP | 2004096142 A | 3/2004 |
| EP | 1204217 A1 | 5/2002 | JP | 2004507950 A | 3/2004 |
| EP | 1255369 A1 | 11/2002 | JP | 2004153676 | 5/2004 |
| EP | 1267513 A2 | 12/2002 | JP | 2004158901 A | 6/2004 |
| EP | 1286490 A2 | 2/2003 | JP | 2004162388 A | 6/2004 |
| EP | 1335504 A2 | 8/2003 | JP | 2004194262 A | 7/2004 |
| EP | 1376920 A1 | 1/2004 | JP | 2004221972 | 8/2004 |
| EP | 1392073 A1 | 2/2004 | JP | 2004266818 | 9/2004 |
| EP | 1434365 A2 | 6/2004 | JP | 2004529524 T | 9/2004 |
| EP | 1441469 A2 | 7/2004 | JP | 2004297276 A | 10/2004 |
| EP | 1445873 A2 | 8/2004 | JP | 2004297756 | 10/2004 |
| EP | 1465449 A1 | 10/2004 | JP | 2004534456 | 11/2004 |
| EP | 1478204 A2 | 11/2004 | JP | 2004535106 A | 11/2004 |

| | | | | | | |
|---|---|---|---|---|---|---|
| JP | 2005006337 | 1/2005 | | WO | WO9848581 A1 | 10/1998 |
| JP | 2005020530 | 1/2005 | | WO | WO9853561 | 11/1998 |
| JP | 2005502218 T | 1/2005 | | WO | WO9854919 A2 | 12/1998 |
| JP | 2005506757 | 3/2005 | | WO | WO9941871 A1 | 8/1999 |
| JP | 2005130491 A | 5/2005 | | WO | WO9944313 | 9/1999 |
| JP | 2005197772 | 7/2005 | | WO | WO9944383 A1 | 9/1999 |
| JP | 2005203961 | 7/2005 | | WO | WO9952250 A1 | 10/1999 |
| JP | 2005521327 | 7/2005 | | WO | WO9953713 | 10/1999 |
| JP | 2005521358 | 7/2005 | | WO | WO9959265 | 11/1999 |
| JP | 2006505172 | 2/2006 | | WO | WO9960729 A1 | 11/1999 |
| JP | 2006211537 A | 8/2006 | | WO | 0002397 | 1/2000 |
| JP | 2007503790 | 2/2007 | | WO | WO0033503 | 6/2000 |
| JP | 2007519281 | 7/2007 | | WO | WO0070897 | 11/2000 |
| JP | 2007520309 A | 7/2007 | | WO | WO0101596 | 1/2001 |
| JP | 2007525043 T | 8/2007 | | WO | WO0117125 A1 | 3/2001 |
| JP | 2007527127 | 9/2007 | | WO | WO0126269 | 4/2001 |
| JP | 2008535398 | 8/2008 | | WO | WO0139523 A2 | 5/2001 |
| JP | 4188372 B2 | 11/2008 | | WO | WO0145300 A1 | 6/2001 |
| JP | 2008546314 | 12/2008 | | WO | WO0148969 A2 | 7/2001 |
| JP | 04694628 B2 | 6/2011 | | WO | WO0158054 A1 | 8/2001 |
| KR | 0150275 B1 | 11/1998 | | WO | WO0160106 | 8/2001 |
| KR | 20000060428 | 10/2000 | | WO | WO0169814 A1 | 9/2001 |
| KR | 100291476 B1 | 3/2001 | | WO | WO0182543 A2 | 11/2001 |
| KR | 20010056333 | 4/2001 | | WO | WO0182544 A2 | 11/2001 |
| KR | 20010087715 A | 9/2001 | | WO | WO0189112 A1 | 11/2001 |
| KR | 20030007965 | 1/2003 | | WO | WO0193505 | 12/2001 |
| KR | 20030035969 A | 5/2003 | | WO | WO0204936 A1 | 1/2002 |
| KR | 20040063057 | 7/2004 | | WO | WO0207375 | 1/2002 |
| KR | 200471652 | 8/2004 | | WO | WO0215616 | 2/2002 |
| KR | 20040103441 A | 12/2004 | | WO | WO0219746 A1 | 3/2002 |
| KR | 20050061559 | 6/2005 | | WO | WO0231991 A2 | 4/2002 |
| KR | 20050063826 A | 6/2005 | | WO | WO0233848 A2 | 4/2002 |
| KR | 100606099 | 7/2006 | | WO | WO0245456 A1 | 6/2002 |
| RU | 95121152 | 12/1997 | | WO | WO0249305 | 6/2002 |
| RU | 2141168 C1 | 11/1999 | | WO | WO0249306 | 6/2002 |
| RU | 2141706 C1 | 11/1999 | | WO | WO0249385 A2 | 6/2002 |
| RU | 2159007 C2 | 11/2000 | | WO | WO02060138 A2 | 8/2002 |
| RU | 2162275 C2 | 1/2001 | | WO | WO02065675 | 8/2002 |
| RU | 2192094 | 10/2002 | | WO | WO02082689 A2 | 10/2002 |
| RU | 2197778 C2 | 1/2003 | | WO | WO02082743 A2 | 10/2002 |
| RU | 2207723 C1 | 6/2003 | | WO | WO02089434 A1 | 11/2002 |
| RU | 2208913 | 7/2003 | | WO | WO02093782 A1 | 11/2002 |
| RU | 2210866 C2 | 8/2003 | | WO | WO02093819 A1 | 11/2002 |
| RU | 2216101 C2 | 11/2003 | | WO | WO02100027 A1 | 12/2002 |
| RU | 2216105 C2 | 11/2003 | | WO | WO03001696 A2 | 1/2003 |
| RU | 2225080 C2 | 2/2004 | | WO | WO03001761 A1 | 1/2003 |
| RU | 2235429 | 8/2004 | | WO | WO03003617 | 1/2003 |
| RU | 2235432 | 8/2004 | | WO | WO03019819 | 3/2003 |
| RU | 2237379 C2 | 9/2004 | | WO | WO03030414 A1 | 4/2003 |
| RU | 2238611 C1 | 10/2004 | | WO | WO03034644 A1 | 4/2003 |
| RU | 2242091 C2 | 12/2004 | | WO | WO03043262 A1 | 5/2003 |
| RU | 2003125268 | 2/2005 | | WO | WO03043369 | 5/2003 |
| RU | 2285388 | 3/2005 | | WO | WO03058871 A1 | 7/2003 |
| RU | 2250564 | 4/2005 | | WO | WO03067783 | 8/2003 |
| RU | 2257008 | 7/2005 | | WO | WO03069832 A1 | 8/2003 |
| RU | 2267224 | 12/2005 | | WO | WO03073646 | 9/2003 |
| RU | 2005129079 A | 2/2006 | | WO | WO03075479 A1 | 9/2003 |
| RU | 2285338 C2 | 10/2006 | | WO | WO03085876 | 10/2003 |
| RU | 2285351 C2 | 10/2006 | | WO | WO03088538 A1 | 10/2003 |
| RU | 2292655 | 1/2007 | | WO | WO03094384 | 11/2003 |
| RU | 2335864 C2 | 10/2008 | | WO | WO03103331 | 12/2003 |
| RU | 2349043 C2 | 3/2009 | | WO | WO04002047 | 12/2003 |
| SU | 1320883 | 6/1987 | | WO | WO2004004370 | 1/2004 |
| TW | 508960 | 11/2002 | | WO | WO2004008671 | 1/2004 |
| TW | 510132 | 11/2002 | | WO | WO2004008681 A1 | 1/2004 |
| TW | 200302642 | 8/2003 | | WO | WO2004015912 | 2/2004 |
| TW | 200401572 | 1/2004 | | WO | WO2004016007 | 2/2004 |
| TW | I232040 | 5/2005 | | WO | WO2004021605 A1 | 3/2004 |
| TW | 248266 | 1/2006 | | WO | WO2004023834 A1 | 3/2004 |
| TW | 200718128 | 5/2007 | | WO | WO2004030238 A1 | 4/2004 |
| WO | WO9408432 | 4/1994 | | WO | WO2004032443 A1 | 4/2004 |
| WO | WO9521494 | 8/1995 | | WO | WO2004038954 | 5/2004 |
| WO | WO9613920 A1 | 5/1996 | | WO | WO2004038972 A1 | 5/2004 |
| WO | WO9701256 | 1/1997 | | WO | WO2004038988 | 5/2004 |
| WO | WO9737456 A2 | 10/1997 | | WO | WO2004040690 A2 | 5/2004 |
| WO | WO9746033 A2 | 12/1997 | | WO | WO2004040827 | 5/2004 |
| WO | WO9800946 | 1/1998 | | WO | WO2004047354 A1 | 6/2004 |
| WO | WO9814026 | 4/1998 | | WO | WO2004049618 A1 | 6/2004 |
| WO | WO9837706 A2 | 8/1998 | | WO | WO2004051872 A2 | 6/2004 |

| | | |
|---|---|---|
| WO | WO2004062255 | 7/2004 |
| WO | WO2004064294 | 7/2004 |
| WO | WO2004064295 | 7/2004 |
| WO | WO2004066520 | 8/2004 |
| WO | WO2004068721 A2 | 8/2004 |
| WO | WO2004073276 | 8/2004 |
| WO | WO2004075023 | 9/2004 |
| WO | WO2004075442 | 9/2004 |
| WO | WO2004075448 | 9/2004 |
| WO | WO2004075468 | 9/2004 |
| WO | WO2004075596 | 9/2004 |
| WO | WO2004077850 A2 | 9/2004 |
| WO | WO2004084509 | 9/2004 |
| WO | WO2004086706 A1 | 10/2004 |
| WO | WO2004086711 | 10/2004 |
| WO | WO2004095730 A1 | 11/2004 |
| WO | WO2004095851 | 11/2004 |
| WO | WO2004095854 | 11/2004 |
| WO | WO2004098072 A2 | 11/2004 |
| WO | WO2004098222 | 11/2004 |
| WO | WO2004102815 | 11/2004 |
| WO | WO2004102816 A2 | 11/2004 |
| WO | WO2004105272 A1 | 12/2004 |
| WO | WO2004114549 | 12/2004 |
| WO | WO2005002253 A1 | 1/2005 |
| WO | 2005011163 A1 | 2/2005 |
| WO | 2005018270 | 2/2005 |
| WO | WO2005015795 A1 | 2/2005 |
| WO | WO2005015797 | 2/2005 |
| WO | WO2005015810 | 2/2005 |
| WO | WO2005015941 | 2/2005 |
| WO | WO2005020488 A1 | 3/2005 |
| WO | WO2005020490 | 3/2005 |
| WO | WO2005022811 A2 | 3/2005 |
| WO | WO2005025110 A2 | 3/2005 |
| WO | WO2005032004 A1 | 4/2005 |
| WO | WO2005043855 | 5/2005 |
| WO | WO2005046080 | 5/2005 |
| WO | WO2005055484 A1 | 6/2005 |
| WO | WO2005055527 | 6/2005 |
| WO | WO2005060192 A1 | 6/2005 |
| WO | WO2005065062 A2 | 7/2005 |
| WO | WO2005069538 A1 | 7/2005 |
| WO | WO2005074184 | 8/2005 |
| WO | WO2005096538 | 10/2005 |
| WO | WO2005122628 | 12/2005 |
| WO | 2006007292 A2 | 1/2006 |
| WO | 2006019710 | 2/2006 |
| WO | WO2006026344 | 3/2006 |
| WO | WO2006044487 | 4/2006 |
| WO | 2006069300 | 6/2006 |
| WO | 2006069301 | 6/2006 |
| WO | WO2006069397 | 6/2006 |
| WO | WO2006077696 | 7/2006 |
| WO | WO2006096784 A1 | 9/2006 |
| WO | WO2006099349 A1 | 9/2006 |
| WO | WO2006099545 A1 | 9/2006 |
| WO | WO2006099577 A1 | 9/2006 |
| WO | WO2006127544 A2 | 11/2006 |
| WO | WO2006134032 | 12/2006 |
| WO | WO2006138196 | 12/2006 |
| WO | WO2006138573 | 12/2006 |
| WO | WO2006138581 A2 | 12/2006 |
| WO | WO2007024934 | 3/2007 |
| WO | WO2007024935 | 3/2007 |
| WO | WO2007025160 | 3/2007 |
| WO | WO2007051159 | 5/2007 |

OTHER PUBLICATIONS

Widdup et al., "A highly-parallel VLSI architecture for a list sphere detector," IEEE International Conference, Paris, France, vol. 5, pp. 2720-2725 (2004) XP-10709734A.
International Search Report—PCT/US06/021379—International Search Authority, European Patent Office—Oct. 16, 2006.
Written Opinion—PCT/US06/021379—International Search Authority, European Patent Office—Oct. 16, 2006.
International Preliminary Report on Patentability—PCT/US06/021379—The International Bureau of WIPO, Geneva, Switzerland—Dec. 6, 2007.
H. Sampath et al. "A Fourth Generation MIMO-OFDM Broadband Wireless System: Design, Performance and Field Trial Results", IEEE Communications Magazine, pp. 143-149, Sep. 2002.
Blum et al, "On Optimum Conference Proceedings, MIMO with antenna selection." IEEE International Conference on Communications: Conferences Proceedings, vol. 1, Apr. 28, 2002, pp. 386-390.
Catreux S et al: "Simulation Results for an Interference-Limited Multiple Input Multiple Output Cellular System" pp. 1094-1096; GLOBECOM'00. 2000 IEEE Global Telecommunications Conference San Francisco, CA, Nov. 27-Dec. 1, 2000.
Kiessling et al, "Short-term and long-term diagonalization of correlated MIMO channels with adaptive modulation" IEEE International Symposium on Personal, Indoor and Mobile Radio Communications, vol. 2, Sep. 15, 2002, pp. 593-597.
Kousa M A et al: "Adaptive Binary Coding for Diversity Communication Systems" IEEE International Conference on Personal Wireless Communications Proceedings, pp. 80-84, XP000992269, 1997.
Prasad N et al.: "Analysis of Decision Feedback Detection for MIMO Rayleigh Fading Channels and Optimum Allocation of Transmitter Powers and QAM Constellations," pp. 1-10, 39th Annual Conference on Comm. Control and Comput., Monticello, IL Oct. 2001.
Seong Taek Chung et al: "Low complexity algorithm for rate and power quantization in extended V-BLAST" VTC FALL 2001 IEEE 54th. Vehicular Technology Conference Proceedings, Atlantic City, NJ, Oct. 7-11, 2001, vol. 1 of 4, pp. 910-914, Conf. 54.
Wiesel A et al.: "Efficient implementations of sphere demodulation" Signal Processing Advances in Wireless Communications, 2003. SPAWC 200 3. 4th IEEE Workshop on Rome. Italy Jun. 15-18, 2003, Piscataway, NJ, USA, IEEE, US, Jun. 15, 2003, pp. 36-40, XP010713463.
El Gamal, et al.: "Universal Space-Time Coding," IEEE Transactions on Information Theory, vol. 49, Issue 5, pp. 1097-1119, XP011074756, ISSN: 0018-9448, May 2003.
European Search Report—EP09169034—European Search Authority—Berlin—Oct. 20, 2009.
Qualcomm Europe, Description and link simulations of MIMO schemes for OFDMA based E-UTRA downlink evaluation, 3GPP TSG-RAN WG1 #42 R1-050903, 3GPP, Sep. 2, 2005.
3GPP TS 33.220 V.1.1.0 XX,XX, "3rd Generation Partnership Project; Technical Specification Group Services and System Aspects; Generic Authentication Architecture (GAA); Generic Bootstrapping Architecture (Release 6)" Feb. 9, 2004, pp. 1-17, figure 4, XP002996023.
3rd Generation Partnership Project; Technical Specification Group Radio Access Network; Physical Layer Aspects for Evolved UTRA (Release 7), 3GPP TR 25.814 v0.3.1 (Nov. 2005).
B. Sklar: "The process of thus correcting the channel-induced distortion is called equalization", Digital Communications, PTR Prentice Hall, Upper Saddle River, New Jersey, 1998, Formatting and Baseband Transmission, Chap. 2, Section 2.11.2, pp. 104-106.
Bahai, Saltzberg: "System Architecture," Multi-Carrier Digital Communications, Kluwer Academic, New York, NY, XP-002199501, 1999, pp. 17-21.
Bingham: "Other Types of MCM," ADSL, VDSL, and Multicarrier Modulation, John Wiley & Sons, New York, XP-002199502. 2000, pp. 111-113.
Chennakeshu, et al. "Capacity Analysis of a TDMA-Based Slow-Frequency -Hopped Cellular System," IEEE Transaction on Vehicular Technology, vol. 45., No. 3 Aug. 1996, pp. 531-542.
Chiani, et al. "Outage Evaluation for Slow Frequency-Hopping Mobile Radio Systems" IEEE Transactions on Communications, vol. 47, No. 12, Dec. 1999, pp. 1865-1874.
Choi, et al., "Design of the Optimum Pilot Pattern for Channel Estimation in OFDM Systems," Global Telecommunications Conference, IEEE Communications Society, Globecom, Dallas, Texas (2004), p. 3661-3665.
Czylwik: "Comparison Between Adaptive OFDM and Single Carrier Modulation with Frequency Domain Equalization," IEEE 47th Vehicular Technology Conference, vol. 2, May 4-7, 1997, pp. 865-869.

Das, Arnab, et al. "Adaptive, asynchronous incremental redundancy (A-IR) with fixed transmission time intervals TTI for HSDPA." IEEE, Personal, Indoor and Mobile Radio Communications, 2002. The 13th IEEE International Symposium on, pp. 1083-1087.

Das et al., "On the Reverse Link Interference Structure for Next Generation Cellular Systems," Global Telecommunications Conference, 2004. GLOBECOM '04, IEEE, vol. 5 IEEE Nov.29-Dec. 3, 2004, pp. 3068-3072.

Dierks, et al., "The TLS Protocol", Version 1.0, Network Working Group, Request for Comments 2246, pp. 1-80 (Jan. 1999).

Digital cellular telecommunications system (Phase 2+); Mobile radio interface layer 3 specification (GSM 04.08 version 7.7.1 Release 1998); ETSI EN 300 940 V7.7.1 (Oct. 2000), pp. 1,2,91-93.

Dinis R; Falconer D; Tong Lam C; Sabbaghian M: "A Multiple Access Scheme for the Uplink of Broadband Wireless Systems" Global Telecommunications Conference, 2004. GLOBECOM ''04. IEEE Dallas, TX, USA Nov. 29-Dec. 3, 2004, vol. 6, pp. 3808-3812, XP010758449 Piscataway, NJ, USA, IEEE.

Don Torrieri, "Cellular Frequency-Hopping CDMA Systems," IEEE Vehicular Technology Conference, May 16, 1999, pp. 919-925, vol. 2.

Favre et al: "Self-Adaptive Transmission Procedure" IBM Technical Disclosure Bulletin, IBM Corporation, Sep. 1976, vol. 19, No. 4, pp. 1283-1284, New York, New York.

Fuchs, et al., "A Novel Tree-Based Scheduling Algorithm for the Downlink of Multi-User MIMO Systems with ZF Beamforming," IEEE International Conference on Acoustics, Speech, and Signal Processing, Philadelphia, pp. 1121-1124, Mar. 18-23, 2005.

Hermann Rohling et al.,: "Performance Comparison of Different Multiple Access Schemes for the Downlink of an OFDM Communication System", Vehicular Technology Conference, 1997, 47th IEEE, vol. 3, May 3-7, 1997, pp. 1365-1369.

Hill, et al., "Cyclic Shifting and Time Inversion of Partial Transmit Sequences to Reduce the Peak-to-Average Power Ratio in OFDM," IEEE International Symposium on Personal, Indoor and Mobile Radio Communications, vol. 2, Sep. 18, 2000, Piscataway, NJ, pp. 1256-1259.

Hui Won Je et al, "A Novel Multiple Access Scheme for Uplink Cellular Systems," Vehicular Technology Conference, 2004, VTC2004-fall, 2004 IEEE 60th Los Angeles, CA, US, Sep. 26-29, 2004, Piscataway, NY, pp. 984-988.

John B. Groe, Lawrence E. Larson, "CDMA Mobile Radio Design" Sep. 26, 2001, Artech House, Norwood, MA02062 580530, XP002397967, pp. 157-159.

J.S. Chow and J.M. Cioffi: "A cost-effective maximum likelihood reciever for multicarrier systems", Proc. IEEE Int. Conf. On Comm., pp. 948-952, Jun. 1992.

Kaleh: "Channel Equalization for Block Transmission Systems," IEEE Journal on Selected Areas in Communications, vol. 13, No. 1, Jan. 1995, pp. 110-121.

Kappes, J.M., and Sayegh, S.1., "Programmable Demultiplexer/Demodulator Processor," COMSAT Laboratories, IEEE, 1990, pp. 230-234.

Karsten Bruninghaus et al., : "Multi-Carrier Spread Spectrum and It's relationship to Single-Carrier Transmission", Vehicular technology Conference, 1998, VTC 98, 48th IEEE, vol. 3, May 18-21, 1998, pp. 2329-2332.

Keller, et al.: "Adaptive Multicarrier Modulation: A Convenient Framework for Time-Frequency Processing in Wireless Communications," Proceedings of the IEEE, vol. 88, No. 5, May 2000, pp. 611-640.

Kim, et al. "Performance of TDMA System With SFH and 2-Bit Differentially Detected GMSK Over Rayleigh Fading Channel," IEEE Vehicular Technology Conference, Apr. 28, 1996, pp. 789-793.

Kishiyama et al., Investigation of optimum pilot channel structure for VSF-OFCDM broadband wireless access in forward link, VTC 2003-Spring, The 57th IEEE Semiannual Vehicular Technology Conference, Proceedings JEJU, Korea, Apr. 22-25, 2003, pp. 139-144.

Kostic, et al. "Dynamic Frequency Hopping in Wireless Cellular Systems-Simulations of Full-Replacement and Reduced-Overhead Methods," IEEE Vehicular Technology Conference, May 16, 1999, pp. 914-918.

Kostic, et al. "Fundamentals of Dynamic Frequency Hopping in Cellular Systems," IEEE Journal on Selected Areas in Communications, vol. 19, No. 11, Nov. 2001, pp. 2254-2266.

Lacroix, et al.: "A Study of OFDM Parameters for High Data Rate Radio LAN's," 2000 IEEE 51st Vehicular Technology Conference Proceedings, vol. 2, May 15-18, 2000, pp. 1075-1079.

Laroia, R. et al: "An integrated approach based on cross-layer optimization—Designing a mobile broadband wireless access network" IEEE Signal Processing Magazine, IEEE Service Center, Piscataway, NJ, US, vol. 21, No. 5, Sep. 2004, pp. 20-28, XP011118149.

Lau, et al., "On the Design of MIMO Block-Fading Channels with Feedback-Link Capacity Constraint," IEEE Transactions on Communications, IEEE Service Center, Piscataway, NJ, US, v. 52, No. 1, Jan. 2004, pp. 62-70, XP001189908.

Leon, et al., "Cyclic Delay Diversity for Single Carrier-Cyclic Prefix Systems," Conference Record of the Thirty-Ninth Asilomar Conference on Signals, Systems and Computers, Oct. 28, 2005, Piscataway, NJ, pp. 519-523.

Lettieri et al: "Adaptive frame length control for improving wireless link throughput, range, and energy efficiency", INFOCOM 98, 17th Annual Joint Conference of the IEEE Computer and Communications Societies, Mar. 29-Apr. 2, 1998, pp. 564-571, vol. 2, IEEE San Francisco, CA, New York, New York.

Lott: "Comparison of Frequency and Time Domain Differential Modulation in an OFDM System for Wireless ATM," 1999 IEEE 49th Vehicular Technology Conference, vol. 2, Jul. 1999, pp. 877-883.

Mignone, et al.: "CD3-OFDM: A New Channel Estimation Method to Improve the Spectrum Efficiency in Digital Terrestrial Television Systems," International Broadcasting Convention, Sep. 14-18, 1995 Conference Publication No. 413, IEE 1995, pp. 122-128.

Molisch, et al., MIMO systems with antenna selection, IEEE Microwave Magazine, Mar. 2004, pp. 46-56, XP002411128.

Naofal Al-Dhahir: "A Bandwidth-Optimized Reduced-Complexity Equalized Multicarrier Transceiver", IEEE Transactions on Communications, vol. 45, No. 8, Aug. 1997.

Naofal Al-Dhahir: "Optimum Finite-Length Equalization for Multicarrier Transceivers", IEEE Trans. On Comm., pp. 56-64, Jan. 1996.

Nassar et al., "Introduction of Carrier Interference to Spread Spectrum Multiple Access," Wireless Communications and Systems, 1999 Emerging Technologies Symposium, IEEE, Apr. 12-13, 1999, pp. 1-5.

Natarajan, et al., "High-Performance MC-CDMA via Carrier Interferometry Codes," IEEE Transactions on Vehicular Technology, 2001, vol. 50 (issue 6).

Nokia, "Uplink Considerations for UTRA LTE", 3GPP TSG RAN WG1#40bis, Beijing, CN, R1-050251, 3GPP, Apr. 4, 2005, pp. 1-9.

NTT DoCoMo, "Downlink Multiple Access Scheme for Evolved UTRA", 3GPP R1-050249, 3GPP, Apr. 4, 2005, pp. 1-8.

NTT DoCoMo, et al.: "Orthogonal Common Pilot Channel and Scrambling Code in Evolved UTRA Downlink," 3GPP TSG RAN WG1 #42 on LTE (Original R1-050589), R1-050704, London UK, pp. 1-8, Aug. 29-Sep. 2, 2005.

Qualcomm Europe: "Description and link simulations for OFDMA based E-UTRA uplink" 3GPP Draft; R1-051100, 3rd Generation Partnership Project (3GPP), Mobile Competence Centre; 650, Route Des Lucioles; F-06921 Sophia-Antipolis Cedex; France, vol. RAN WG1, No. San Diego, USA; 20051004, Oct. 4, 2005, pp. 1-10, XP050100715.

S. Nishimura et al., "Downlink Nullforming by a Receiving Antenna Selection for a MIMO/SDMA Channel", Technical Search Report of Electric Information Communication Academic Conference, Feb. 28, 2002, vol. 101, No. 683, pp. 17-22, RCS 2001-286.

Sandeep Chennakeshu et al., "A comparison of diversity schemes for a mixed-mode slow frequency-hopped cellular system," Global Telecommunications Conference, 1993, including a Communications Theory Mini-Conference. Technical Program Conference Record, IEEE in Houston. GLOBECOM ''93, IEEE, Nov. 29, 1993, pp. 1749-1753, vol. 3.

Sari, et al., "Transmission Techniques for Digital Terrestrial TV Broadcasting," IEEE Communications Magazine, Feb. 1995, pp. 100-109.

Schnell et al., "Application of IFDMA to Mobile Radio Transmission", IEEE 1998 International Conference on Universal Personal Communications, vol. 2, Oct. 5-9, 1998, pp. 1267-1272.

Schnell et al.,: "A Promising New Wideband Multiple-Access Scheme for Future Mobile Communications Systems" European Transactions on Telecommunications, vol. 10, No. 4, Jul. 1999, pp. 417-427.

Shattil et al., "Array Control Systems for Multicarrier Protocols Using a Frequency-Shifted Feedback Cavity", Radio and Wireless Conference EEE, Aug. 1-4, 1999, pp. 215-218.

Sorger U., et al., "Interleaved FDMA-A New Spread-Spectrum Multiple-Access Scheme, XP010284733," Communications, Conference Record, IEEE, Atlanta, GA, 1998, 1013-1017.

Telecommunications Industry Association, "Mobile Station-Base Station Compatibility Standard for Dual-Mode Wideband Spread Spectrum Cellular System," TIA/EIA-95, Jul. 1993.

Tellado, "Multicarrier Modulation with Low Par," Kluwer Academic, Dordrecht, NL, XP-002199500, 2000, pp. 6-11 and 55-60.

Tellambura, "Use of m-sequences for OFDM Peak-to-Average Power Ratio Reduction," Electronics Letters, vol. 33, No. 15, Jul. 17, 1997, pp. 1300-1301.

TIA/EIA/IS-2000 Standards for CDMA2000 Spread Spectrum Systems 3GPP2 C.S0001-0 Version 1.0, Jul. 1999.

TIA/EIA/IS-95, Mobile Station-Base Station Compatibility Standard for Dual-Mode Wideband Spread Spectrum Cellular System, Jul. 1993, Sections 6-25-6-26.

TIA-1121.001 "Physical Layer for Ultra Mobile Broadband (UMB) Air Interface Specification," 3GPP2 C.S0084-001-0, Version 2.0 (Aug. 2007).

TIA-1121.002 "Medium Access Control Layer for Ultra Mobile Broadband (UMB) Air Interface Specification," 3GPP2 C.S0084-002-0, Version 2.0 (Aug. 2007).

Tomcik J, "MBFDD and MBTDD Wideband Mode: Technology Overview", IEEE 802.20 Working Group Mobile Broadband Wireless Access, Jan. 6, 2006, 1-109.

Tomcik, T.: "QTDD Performance Report 2", IEEE C802.20-05/88, IEEE 802.20 Working Group on Mobile Broadband Wireless Access, http://ieee802.org/20/, pp. 1-56, XP002386798 (Nov. 15, 2005).

Toufik, I. et al., Channel allocation algorithms for multi-carrier systems, Vehicular Technology Conference 2004, VTC2004-FALL, 2004 IEEE 60th Los Angeles, CA, USA Sep. 26-29, 2004, Piscataway, NJ, USA IEEE, Sep. 26, 2004, pp. 1129-1133, XP010786798.

Wang et al., "Improving performance of multi-user OFDM systems using bit-wise interleaver" Electronics Letters IEE Stevenage, GB, vol. 37. No. 19, Sep. 13, 2001, pp. 1173-1174 XP006017222.

Xiaodong, et al., "M-Sequences for OFDM Peak-to-Average Power Ratio Reduction and Error Correction," Electronics Letters, vol. 33, Issue 7, Mar. 27, 1997, pp. 554-555.

Yun et al., "Performance of an LDPC-Coded Frequency-Hopping QFDMA System Based on Resource Allocation in the Uplink" Vehicular Technology—Conference 2004. VTO 2004-Spring, 2004 IEEE 59th Milan, Italy May 17-19, 2004, Piscataway, NJ, USA, vol. 4, May 17, 2004. pp. 1925-1928. XP010766497.

Zekri, et al., "DMT Signals with Low Peak-to-Average Power Ratio," Proceedings, IEEE International Symposium on Computers and Communications, 1999, Jul. 6-8, 1999, pp. 362-368.

Groe, J., et al., "CDMA Mobile Radio Design," Sep. 26, 2001, Artech House, Inc. Norwood, MA, pp. 257-259.

Guo, K. et al.: "Providing end-to-end QoS for multimedia applications in 3G wireless networks," Proceedings vol. 5242, SPIE ITCom 2003 Conf. Internet Multimedia Management Systems IV, Nov. 26, 2003, pp. 1-14, DOI: 10.1117/12.514061.

Maniatis, I. et al., "Pilots for joint channel estimation in multi-user OFDM mobile radio systems," 2002 IEEE Seventh International Symposium on Spread Spectrum Techniques and Applications, Prague, Czech Republic, Sep. 2, 2002, pp. 44-48, XP010615562.

Sumii, Kenji, et al., "A Study on Computational Complexity Reduction of Iterative Decoding for Turbo-coded MIMO-SDM Using Sphere Decoding," Technical Report of IEICE. RCS, Nov. 9, 2010, vol. 104, No. 675, pp. 43-48.

Tomcik, Jim: "QFDD Technology Overview Presentation," IEEE 802.20 Working Group on Mobile Broadband Wireless Access, [Online] Nov. 15, 2005, pp. 1-73, XP002467626.

Voltz, P. J., "Characterization of the optimum transmitter correlation matrix for MIMO with antenna subset selection", IEEE Transactions on Communications, vol. 51, No. 11, pp. 1779-1782, (Nov. 1, 2003).

Yongmei Dai,; Sumei Sun; Zhongding Lei; Yuan Li.: "A List Sphere Decoder based turbo receiver for groupwise space time trellis coded (GSTTC) systems," 2004 IEEE 59th Vehicular Technology Conference, vol. 2, pp. 804-808, May 17, 2004, doi: 10.1109/VETECS.2004.1388940.

Sklar, B., "The process of thus correcting the channel-induced distortion is called equalization", Digital Communications, PTR Prentice Hall, Upper Saddle River, New Jersey, 1998, Formatting and Baseband Transmission, Chap. 2, Section 2.11.2, pp. 104-106.

Dammann, A. et al., "Beamforming in Combination with Space-Time Diversity for Broadband OFDM Systems", ICC 2002. 2002 IEEE International Conference on Communications. Apr. 28-May 2, 2002, pp. 165-171, XP010589479.

Viswanath P. et al: "Opportunistic beamforming using dumb antennas" IEEE Transactions on Information Theory IEEE USA, vol. 48, No. 6, Jun. 2002, pp. 1277-1294, XP002314708 ISSN: 0018-9448 abstract right-hand column, paragraph 1.

Alcatel-Lucent, et al., "Dedicated Reference Signals for Precoding in E-UTRA Downlink" 3GPP Draft; R1-071718, 3rd Generation Partnership Project (3GPP), Mobile Competence Centre; 650, Route Des Lucioles; F-06921 Sophia-Antipolis Cedex; France, vol. RAN WG1, no. St. Julian; 20070403, Apr. 3, 2007, XP050105640 [retrieved on Apr. 3, 2007].

Bengtsson, M. et at, "A Generalization of Weighted Subspace Fitting to Full-Rank Models", IEEE Transactions on Signal Processing, IEEE Service Center, New York, NY, US, vol. 49, No. 5, pp. 1002-1012, May 1, 2001.

Ken Murakami et al., "Status Toward Standardization at IEEE 802.3ah and items on the construction of GE-PON system," Technical Report of the Institute of Electronics, Information and Communication Engineers, Jun. 13, 2003, vol. 103, No. 124, pp. 1-6, IN2003-24.

Physical Channels and Multiplexing in Evolved UTRA Downlink TSG-RAN Working Group 1 Meeting, XX, XX, vol. RI-050590, Jun. 20, 2005, pp. 1-24, XP003006923 the whole document.

Siemens, "Evolved UTRA uplink scheduling and frequency reuse" [online], 3GPP TSG-RAN WG1 # 41 R1-050476, Internet <URL:http://www.3gpp.org/ftp/tsg_ran/WG1_RL1/TSGR1_41/Docs/R1-050476.zip>, May 9, 2005.

Yatawatta, S. et al., "Energy Efficient Channel Estimation in MIMO Systems", 2005 IEEE International Conference on Acoustics, Speech, and Signal Processing, Mar. 18-23, 2005, Philadelphia, vol. 4, pp. 317-320, Mar. 18, 2005.

Miorandi D., et al., "Analysis of master-slave protocols for real-time industrial communications over IEEE 802.11 WLANs" Industrial Informatics, 2004. INDIN '04, 2nd IEEE International Conference on Berlin, Germany Jun. 24-26, 2004. Piscataway, NJ, USA IEEE, Jun. 24, 2004, pp. 143-148, XP010782619, ISBN 0789385136, Para 3, point B.

Anonymous: "3GPP TS 36.211 V8.0.0; Evolved Universal Terrestrial Radio Access (E-UTRA); Physical channels and modulation (Release 8)" 3rd Generation Partnership Project; Technical Specification Group Radio Access Network, [Online] 2007, XP002520076 Retrieved from the Internet: URL:http://www.Sgpp.org/ftp/Specs/html-i nfo/36211.htm> [retrieved on Sep. 27, 2007] Section 5.

Jim Tomcik, QFDD and QTDD: Technology Overview, IEEE 802.20 Working Group on Mobile Broadband Wireless Access, Oct. 28, 2005, pp. 48-50, URL, http://www.ieee802.org/20/contribs/c802.20-05-68.zip.

Nokia: "Compact signalling of multi-code allocation for HSDPA", version 2,3GPP R1-02-0018, Jan. 11, 2002.

Sethi M, et al., "Code Reuse DS-CCMA—A Space Time Approach", Proceedings of the 2002 IEEE International Conference on Acoustics, Speech, and Signal Processing (ICASSP), pp. 2297-2300, May 13-17, 2002.

* cited by examiner

SPHERE DECODING APPARATUS

CLAIM OF PRIORITY UNDER 35 U.S.C. §119

The present Application for Patent claims priority to Provisional Application No. 60/686,819 entitled "MIMO-Single Code Word Receivers with List Sphere Decoding" filed Jun. 1, 2005, assigned to the assignee hereof, and hereby expressly incorporated by reference herein.

REFERENCE TO CO-PENDING APPLICATIONS FOR PATENT

The present Application for Patent is related to co-pending U.S. patent application Ser. No. 11/022,347 entitled "Capacity based rank prediction for MIMO design," assigned to the assignee hereof, and expressly incorporated by reference herein.

BACKGROUND

1. Field

The present disclosure relates generally to communications, and, more specifically, to techniques for decoding codewords received over a communications channel.

2. Background

In a wireless communication system, an RF modulated signal from a transmitter may reach a receiver via a number of propagation paths. The characteristics of the propagation paths typically vary over time due to a number of factors such as fading and multipath. To provide diversity against deleterious path effects and improve performance, multiple transmit and receive antennas may be used. If the propagation paths between the transmit and receive antennas are linearly independent (i.e., a transmission on one path is not a linear combination of the transmissions on the other paths), then the likelihood of correctly receiving a data transmission increases as the number of antennas increases. Generally, diversity increases and performance improves with more transmit and receive antennas.

A multiple-input multiple-output (MIMO) communication system can employ multiple ($N_T$) transmit antennas and multiple ($N_R$) receive antennas for data transmission. A MIMO channel formed by the $N_T$ transmit and $N_R$ receive antennas may be decomposed into $N_S$ independent channels, with $N_S \leq \min\{N_T, N_R\}$. Each of the $N_S$ independent channels corresponds to a dimension, and may also be referred to as a spatial subchannel (or a transmission channel) of the MIMO channel. The MIMO system can provide improved performance (e.g., increased transmission capacity) if the additional dimensionalities created by the multiple transmit and receive antennas are utilized.

For a full-rank MIMO channel, where $N_S=N_T \leq N_R$, an independent data stream may be transmitted from each of the $N_T$ transmit antennas. The transmitted data streams may experience different channel conditions (e.g., different fading and multipath effects) and may achieve different signal-to-noise-and-interference ratios (SNRs) for a given amount of transmit power. Moreover, if successive interference cancellation (SIC) is used at the receiver to recover the transmitted data streams, then different SNRs may be achieved for the data streams depending on the specific order in which the data streams are recovered. Consequently, each data stream may support a unique data rate. Since channel conditions typically vary with time, the data rate supported by each data stream may also vary with time.

A MIMO design can have multiple modes of operation. In one mode of operation, the transmitter can encode the data transmitted on each spatial layer independently, possibly with different rates. The receiver can employ an SIC algorithm that works as follows: Decode the first layer, and then subtract its contribution from the received signal after re-encoding and multiplying the encoded first layer with an "estimated channel," then decode the second layer, and so on. This approach means that each successively decoded layer sees increased signal-to-noise ratio (SNR) and hence can support higher rates. In the absence of error propagation, this mode of operation combined with SIC achieves capacity. The disadvantages of this design arise from the burden of "managing" the rates of each spatial layer, in particular (a) increased CQI (channel quality indicator) feedback signaling overhead (one CQI for each layer); (b) increased ACK/NACK messaging (one message for each layer); (c) complications with the Hybrid ARQ (HARQ) scheme, since each layer can terminate at a different transmission; (d) performance sensitivity to channel estimation errors in channels experiencing increased Doppler effect and/or low SNR; and (e) tighter decoding latency requirements since each successive layer cannot be decoded until the prior layers are decoded. In other modes, a common encoding of a single data stream from a single antenna is provided. Alternatively, a transmitter may encode the data on each spatial layer using the same data rate for each layer, and rank prediction may be employed to adapt the number of spatial layers on a packet-by-packet basis depending on the channel conditions and the SNR.

To decode the received codewords, a receiver can employ a low complexity linear receiver such as an MMSE (minimum mean squared error) equalizer for each tone. Alternatively, non-linear receivers such as an ML (maximum likelihood) MIMO decoder can be used to achieve better performance at the cost of a more complex implementation. In particular, the complexity of an ML MIMO decoder is exponential with the rank M and the symbol constellation order Mc. For an overview of prior art decoders for MIMO, see Hochwald and Brink, "Achieving Near-Capacity on a Multiple-Antenna Channel," *IEEE Transactions on Communications*, Vol. 51, No. 3, March 2003, the contents of which are herein incorporated by reference in their entirety.

SUMMARY

The disclosure provides methods and apparatuses for decoding codewords over a communications channel. One aspect of the disclosure provides a method comprising receiving at least one codeword sent over a multiple-input multiple-output (MIMO) channel, wherein the at least one codeword comprises a plurality of layers, each layer comprising a constellation point of a plurality of candidate constellation points. The method further comprises for each layer, computing a state cost metric using said codeword for each constellation point of the at least one layer and selecting preferred states of the at least one layer whose state cost metrics meet first preferred criteria, and for each of a plurality of constellation points of said layer, computing a state cost metric using said codeword for each transition from a preferred constellation point of said layer to each constellation point of a following layer, and selecting preferred transitions to said following layer whose state cost metrics meet second preferred criteria.

A further aspect of the disclosure provides a decoding method comprising receiving a codeword comprising a plurality of symbols, each symbol corresponding to at least one of a plurality of candidate constellation points. The method comprises, for a first symbol, computing a cost metric for each candidate constellation point of said first symbol and storing in a memory only those candidate constellation points whose computed cost metrics meet first preferred criteria. The method further comprises for each following symbol and for each candidate constellation point previously stored in said memory for the symbol immediately preceding said following symbol, computing a cost metric for each candidate transition from said previously stored candidate constellation point to a candidate constellation point of said following symbol, and storing in said memory only those candidate transitions whose computed cost metrics meet second preferred criteria.

Yet a further aspect of the disclosure provides a decoder apparatus comprising a receiver configured to receive at least one codeword, wherein the at least one codeword comprises a plurality of layers, each layer comprising a constellation point selected from a plurality of candidate constellation points. The decoder further comprises processor configured to, for at least one layer, compute a constellation point metric for the at least one layer, and to select preferred constellation points of the at least one layer whose state cost metrics meet first preferred criteria; the processor further configured to compute a constellation point cost metric for each transition from a preferred constellation point of the layer to each constellation point of a following layer, and selecting preferred transitions to said following layer whose constellation point cost metrics meet second preferred criteria.

The disclosure further provides other methods and apparatuses that implement various aspects, embodiments, and features of the disclosure, as described in further detail below.

DETAILED DESCRIPTION

Figure 1:
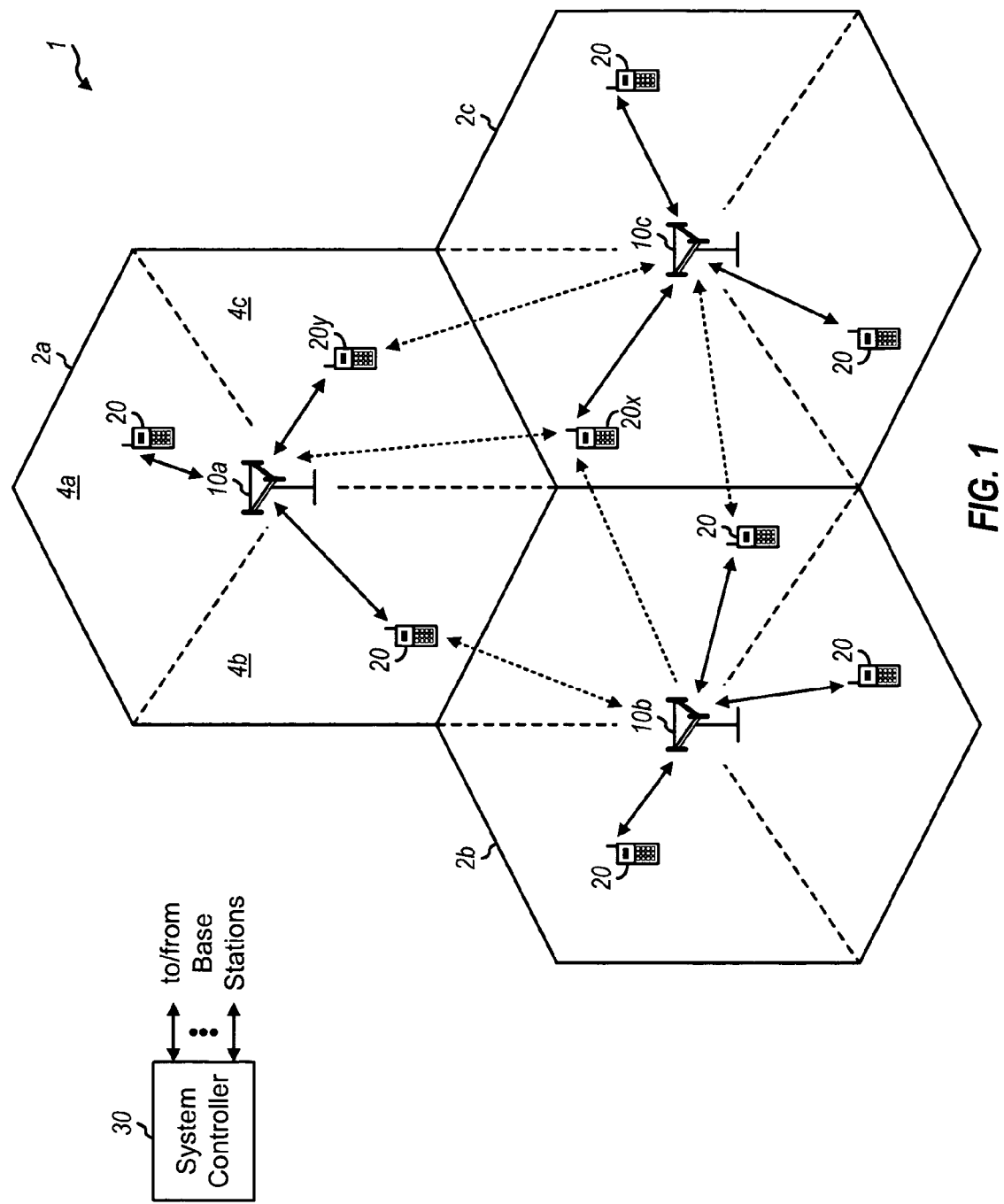
FIG. 1 shows a diagram of a wireless multiple-access communication system.

FIG. 1 shows a wireless communication system 1 with multiple access points (APs) 10 and multiple terminals 20. A base station is a station that communicates with the terminals. A base station may also be called, and may contain some or all of the functionality of, an access point, a Node B, and/or some other network entity. Each access point 10 provides communication coverage for a particular geographic area 2. The term "cell" can refer to an access point and/or its coverage area depending on the context in which the term is used. To improve system capacity, an access terminal coverage area may be partitioned into multiple smaller areas, e.g., three smaller areas 4a, 4b, and 4c. Each smaller area is served by a respective base transceiver subsystem (BTS). The term "sector" can refer to an AP and/or its coverage area depending on the context in which the term is used. For a sectorized cell, the APs for all sectors of that cell are typically co-located within the base station for the cell. The signaling transmission techniques described herein may be used for a system with sectorized cells as well as a system with un-sectorized cells. For simplicity, in the following description, the term "base station" is used generically for a station that serves a sector as well as a station that serves a cell.

Terminals 20 are typically dispersed throughout the system, and each terminal may be fixed or mobile. A terminal may also be called, and may contain some or all of the functionality of, a mobile station, a user equipment, and/or some other device. A terminal may be a wireless device, a cellular phone, a personal digital assistant (PDA), a wireless modem card, and so on. A terminal may communicate with zero, one, or multiple base stations on the forward and reverse links at any given moment.

For a centralized architecture, a system controller 30 couples to APs 10 and provides coordination and control for these base stations. System controller 30 may be a single network entity or a collection of network entities. For a distributed architecture, the APs may communicate with one another as needed.

Figure 2:
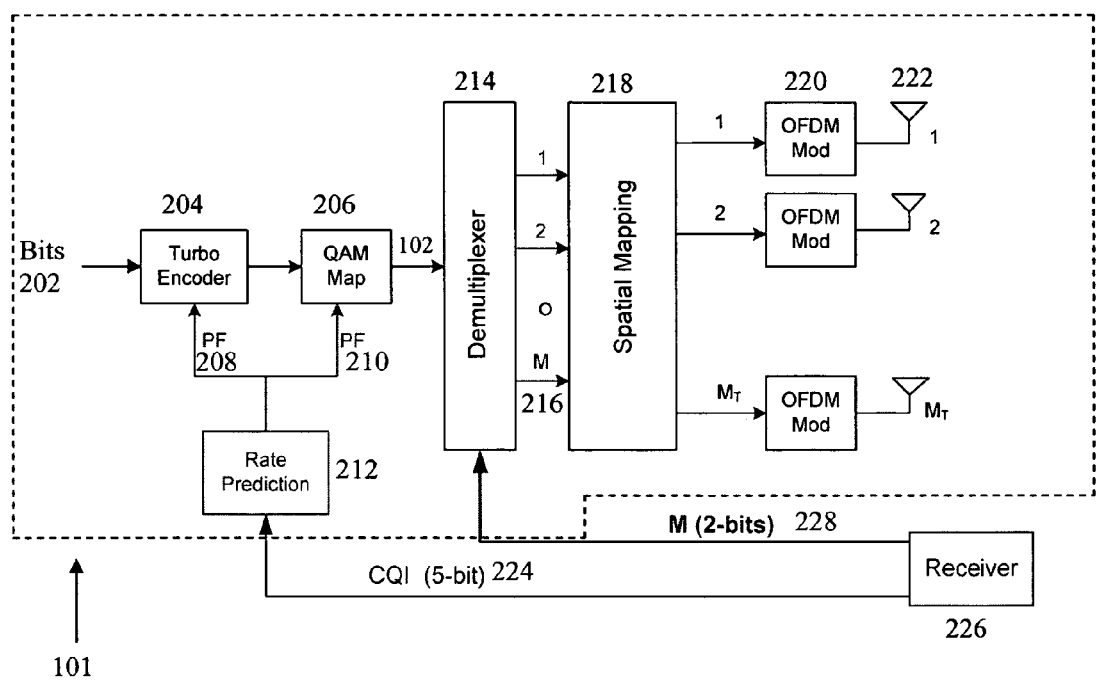
FIG. 2 shows a communication system comprising an SCW transmitter with rank prediction.

FIG. 2 shows an SCW transmitter with rank prediction. The bits 202 are turbo-encoded 204 and QAM mapped 206 depending on the packet format (PF) 208, 210, specified by a rate prediction algorithm 212. In an embodiment, the coded symbols are then de-multiplexed 214 to M streams 216 or layers, where M 228 can be a 2-bit integer specified by the receiver 226 feedback every 5 m-sec, in addition to a 5-bit CQI 224. The M streams 216 are then spatially mapped 218 to $M_T$ OFDM modulators 220 and $M_T$ antennas 222.

Figure 3:
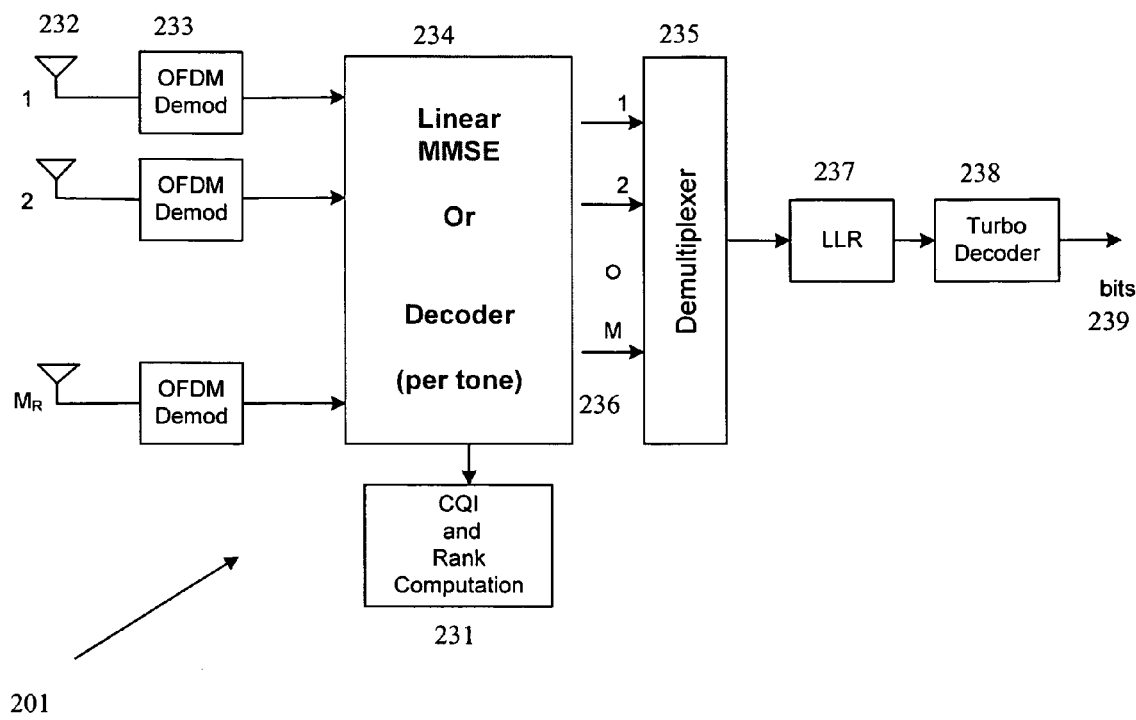
FIG. 3 shows an SCW receiver employing either a linear MMSE equalizer or some type of decoder.

FIG. 3 shows an SCW receiver 201 employing either a linear MMSE equalizer or some type of decoder 234. In this embodiment, $M_R$ antennas 232 receive a signal transmitted over the air. The output of each antenna 232 is OFDM demodulated 233 and input to a linear MMSE equalizer or decoder 234. The linear MMSE equalizer or decoder 234 can each be implemented on a tone-by-tone basis, i.e., for each tone, $M_R$ received signals are processed to generate M symbols 236. The linear MMSE equalizer or decoder 234 can also generate information to allow CQI and rank computation 231. The symbols 236 are demultiplexed 235, and a log-likelihood ratio (LLR) 237 can be calculated for each of the M symbols 236. The LLR's 237 may then be supplied to a turbo decoder 238 which outputs decoded bits 239.

Various decoder implementations for an SCW receiver will now be described herein, in particular, an ML MIMO decoder, a sphere decoder, a list sphere decoder, and a list sphere trellis decoder.

To understand the operation of the ML MIMO decoder, define the following:
$M_R$: Number of Receive Antennas
M: Rank of MIMO Transmission
H: MIMO channel per tone ($M_R \times M$)
x: Received signal vector per tone ($M_R \times 1$)
s: Transmit symbol vector per tone ($M \times 1$)=[$s_1$ $s_2$ ... $s_M$]
n: Noise Vector per tone ($M_R \times 1$)
The system equation for a given tone is given as:

$$x = Hs + n \tag{Eq. 1}$$

The ML MIMO solution is given as:

$$\hat{s}_{ML} = \arg_{s \in \Lambda} \min \|x - Hs\|^2 \tag{Eq. 2}$$

where $\Lambda$ is the lattice defined by having each entry of the M-dimensional vector s be taken from a constellation of $2^{Mc}$ points. It can be seen that the ML MIMO decoder selects the transmit symbol vector $\hat{s}_{ML}$ that maximizes the likelihood of the received signal vector being x. In some aspects, the complexity of the ML MIMO decoder is exponential with the number of MIMO layers M and the symbol constellation order Mc.

To reduce the exponential complexity of ML MIMO decoding, a technique known as sphere decoding may be employed. To understand sphere decoding, first define the QR decomposition of the channel matrix H: H=QR, where Q is an $M_R \times M$ unitary matrix (herein defined as any matrix Q such that Q*Q=I), and R is an upper triangular M×M matrix. Also define $\hat{s}$ to be the zero-forcing solution $$\hat{s} = (H*H)^{-1}H*x. \text{ From Eq. 2,} \quad \text{(Eq. 3)}$$

$$\hat{s}_{ML} = \underset{s \in \Lambda}{\operatorname{argmin}} \|x - Hs\|^2$$

$$= \underset{s \in \Lambda}{\operatorname{argmin}}[(s-\hat{s})*H*H(s-\hat{s}) + x*(I - H(H*H)^{-1}H*)x]$$

$$\leq \underset{s \in \Lambda}{\operatorname{argmin}}(s-\hat{s})*H*H(s-\hat{s}) = r^2$$

According to Eq. 3, the sphere decoder can restrict its search for a sphere decoder solution $\hat{s}_{SD}$ to those hypotheses s located inside a sphere of radius "r" centered about the zero-forcing solution $\hat{s}$. The sphere decoder thus avoids an exhaustive ML search over all possible hypotheses s.

Using the QR decomposition, the expression in Eq. 3 can be further manipulated as follows:

$$\underset{s \in \Lambda}{\operatorname{argmin}}(s-\hat{s})*H*H(s-\hat{s}) = \underset{s \in \Lambda}{\operatorname{argmin}}(s-\hat{s})*R*R(s-\hat{s}) \quad \text{(Eq. 4)}$$

$$= \underset{s \in \Lambda}{\operatorname{argmin}} \sum_{i=1}^{M} R_{ii}^2 \left[ s_i - \hat{s}_i + \sum_{j=i+1}^{M} \frac{R_{ij}}{R_{ii}}(s_j - \hat{s}_j) \right]^2$$

$$= r^2$$

The form of Eq. 4 takes advantage of the fact that R is triangular to conveniently divide the computation of the term to be minimized among the separate layers i. Note that the same will also be true for any lower triangular decomposition of the matrix H. This form suggests a sphere decoding procedure for decoding a received codeword as described below.

Figure 4:
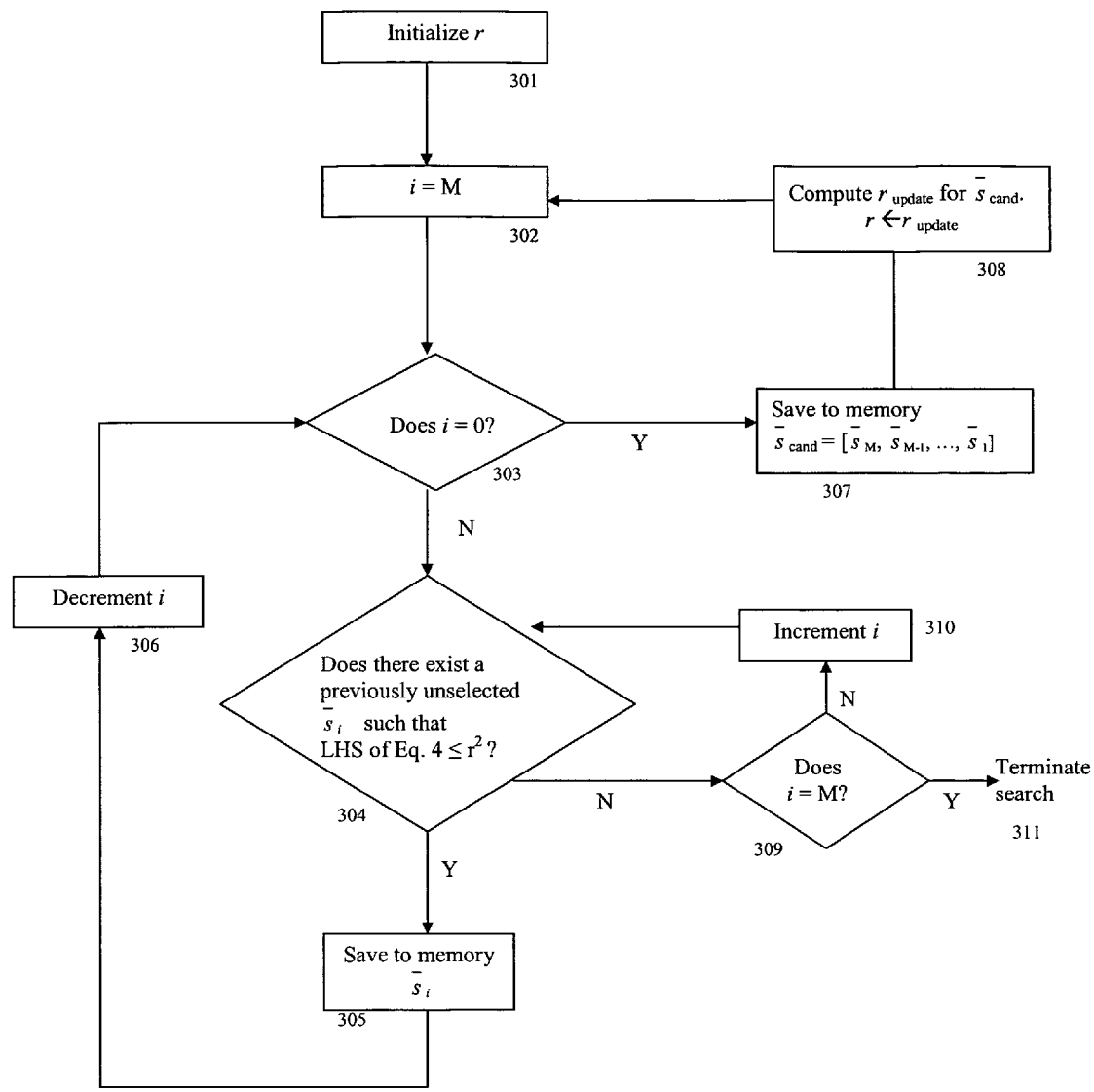
FIG. 4 shows a flow chart of one possible algorithmic implementation of a sphere decoder.

A possible implementation of a sphere decoding procedure is shown in the flow chart diagram of FIG. 4. Note the flow chart diagrams given in this disclosure are only meant to be illustrative of possible implementations, and should not be construed to limit the scope of the disclosure. First, an initial value for the sphere radius r is determined, block 301. Next, set i=M for the Mth layer computation, block 302. From a computational viewpoint, the LHS (left-hand side) of Eq. 4 may become $R_{MM}^2 \|s_M - \hat{s}_M\|^2$, where $s_M \in \Lambda_M$, the constellation used for $M^{th}$ layer. Next, a search over all candidate constellation points is performed to select a candidate constellation point, block 304. In some cases, the constellation point, $\bar{s}_M$, is selected such that $R_{MM}^2 \|\bar{s}_M - \hat{s}_M\|^2 \leq r^2$. The candidate constellation point $\bar{s}_M$ is saved, e.g. in memory, block 305.

The layer being operated on is then decremented, e.g. i=M−1, as shown in block 306. From a computational viewpoint, the LHS of Eq. 4 now becomes $$R_{M-1,M-1}^2 \left[ s_{M-1} - \hat{s}_{M-1} + \frac{R_{M-1,M}}{R_{M-1,M-1}}(\bar{s}_M - \hat{s}_M) \right]^2 + R_{MM}^2 \|s_M - \hat{s}_M\|^2,$$

where $\bar{s}_{M-1} \in \Lambda_{M-1}$, the constellation used for the (M−1)th layer. For SCW design, the constellation used for all layers is the same, i.e., $\Lambda_m = \Lambda$, $\forall m=1,2,\ldots M$ For a given point $\bar{s}_M$, select one constellation point, $\bar{s}_{M-1}$ such that $$R_{M-1,M-1}^2 \left[ \bar{s}_{M-1} - \hat{s}_{M-1} + \frac{R_{M-1,M}}{R_{M-1,M-1}}(\bar{s}_M - \hat{s}_M) \right]^2 + R_{MM}^2 \|s_M - \hat{s}_M\|^2 \leq r^2,$$

If no point $\bar{s}_{M-1}$ is available for the choice of $\bar{s}_M$, then the process reverts back to selecting another constellation point $\bar{s}_M$, as shown in blocks 309 and 310.

For a given pair $\bar{s}_{M-1}, \bar{s}_M$, set i=M−2, and the operations 304-306 may be repeated. This process of determining candidate points is continued for all subsequent layers up to and including i=1, at which point a series of candidate points [$\bar{s}_M$, $\bar{s}_{M-1}, \bar{s}_{M-2}, \ldots, \bar{s}_1$] corresponding to a single candidate solution vector $\bar{s}_{cand}$ is obtained. This may be accomplished by the decrement block 306 and the loop-back to block 303. In the case where i=0, the vector $\bar{s}_{cand}$ is saved, as shown in block 307.

A new update to the radius $r_{update}$ may then be calculated and the radius changed to $r \leftarrow r_{update}$, as shown in block 308. This may be done, for example, by re-calculating LHS of Eq. 4 assuming the above obtained vector point, to obtain a new radius $r_{update}$.

The process may be repeated with this new radius $r_{update}$, and the procedure is continued until there is no candidate solution vector falling within a radius $r_{update}$. Note that the sphere radius shrinks with each iteration, and hence in general the decoder does not need to evaluate all possible candidate points to obtain the sphere decoder solution $\hat{s}_{SD}$.

From the description above, it will be noted that the complexity of the sphere decoder grows with increasing sphere radius "r", and eventually approaches ML complexity. On the other hand, if the radius "r" is selected too small, then the ML solution can potentially lie outside the sphere, leading to incorrect solutions. In general, the preferred sphere radius "r" grows with (a) large eigenvalue spread of the MIMO channel and (b) low SNR. Also, as no soft information is generated by the sphere decoder for alternative codewords, it cannot provide a turbo decoder with soft information for joint decoding.

Figure 5:
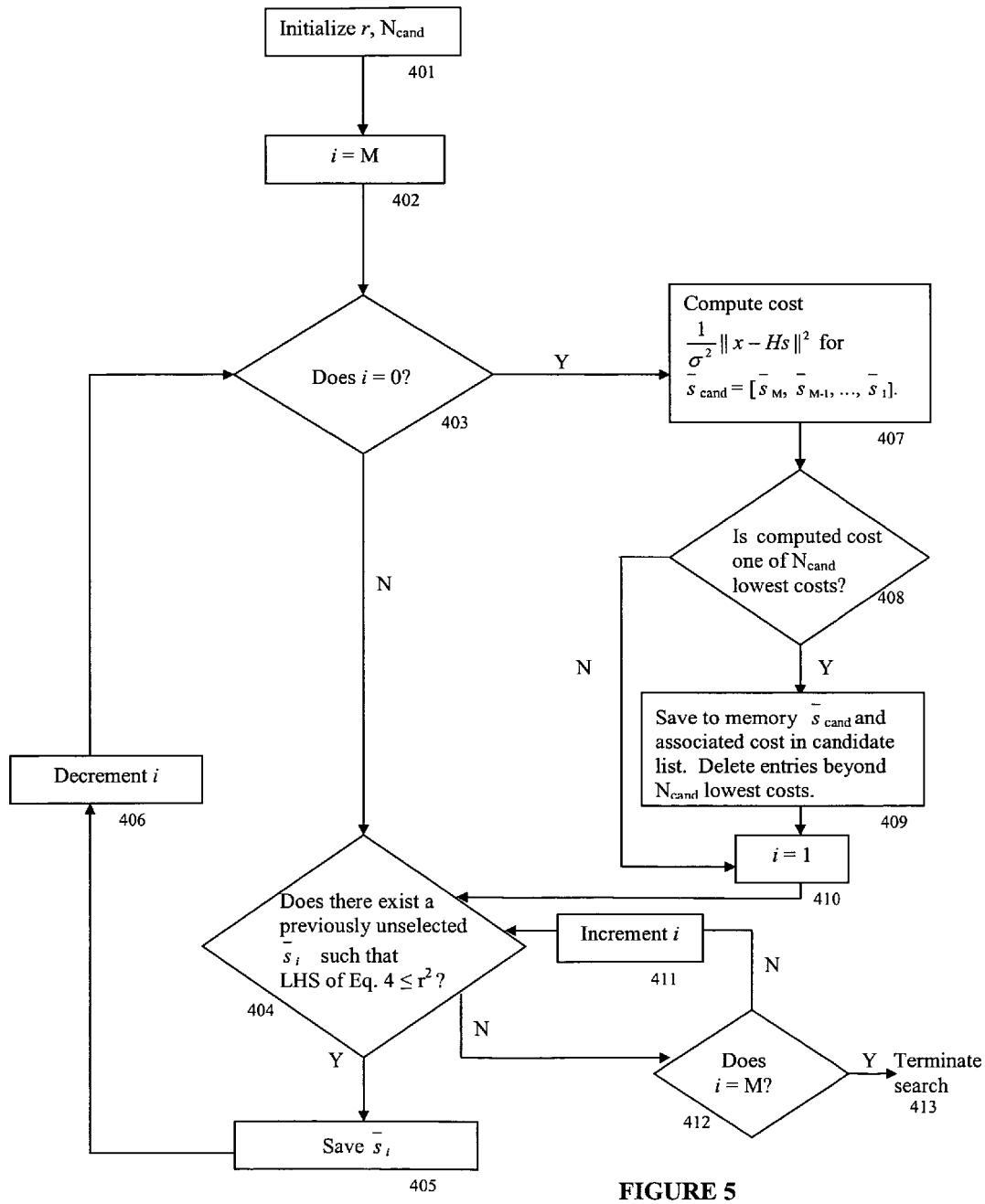
FIG. 5 shows a flow chart of one possible algorithmic implementation of a list sphere decoder.

The list sphere decoder is a MIMO-MAP decoder that is capable of generating soft-information for use by a turbo decoder, and is based on sphere decoder principles. A possible algorithmic implementation of the list sphere decoder is shown in FIG. 5, to which reference will be made in the description below.

As shown in block 401 of FIG. 5, first select a sphere radius "r," as well as a parameter $N_{cand}$ whose function will later be described. Then follow blocks 402-406, analogous to blocks 302-306 of FIG. 4, to arrive at a candidate solution vector $\bar{s}_{cand}$ comprising candidate points [$\bar{s}_M, \bar{s}_{M-1}, \bar{s}_{M-2}, \ldots, \bar{s}_1$]. Once a candidate solution vector is obtained, an associated cost $$\frac{1}{\sigma^2}\|x - Hs\|^2$$

can be computed as shown in 407, and can be utilized by an outer turbo-decoder to improve performance. The cost for a candidate solution vector can be referred to as an "overall" cost metric, as distinguished from a per-layer cost metric such as computed according to the LHS of Eq. 4. Note that the noise variance $\sigma^2$ can in general be different for different tones. The candidate solution vector-cost association can be entered and stored in a "candidate list" as shown in 409. These steps are repeated for other candidate solutions within the sphere radius "r" until $N_{cand}$ candidate solutions reside in the candidate list. The parameter $N_{cand}$ may also be referred to as a "candidate plurality." Thereafter, an additional candidate solution vector is added to the candidate list only if its associated cost is less than the highest cost already on the candidate list. If this is the case, the candidate solution vector cost entry having the highest cost is deleted, thereby maintaining a total of no more than $N_{cand}$ entries in the candidate list at any time. Alternatively, the first $N_{cand}$ costs computed by the decoder for a received codeword can be defined to qualify as one of the $N_{cand}$ lowest costs on the candidate list, and thus a general check can be performed as shown in block 408.

In contrast with the sphere decoder, the list sphere decoder is capable of providing soft information for several candidate codewords, as well as soft information for each bit (or symbol) of each candidate codeword. Thus, it may be used in conjunction with other decoders utilizing a priori soft information, such as a turbo decoder. To see this, let $M_c$ be the modulation order and let M be the rank of the MIMO transmission, resulting in a total of $MM_c$ bits transmitted per tone. In a preferred embodiment, the soft extrinsic information (LLR) for each bit $b_k$, $\forall k=1,2 \ldots MM_c$ can be approximated as:

$$L_E(b_k|x) \approx \max_{s,b_k=1} * \left\{-\frac{1}{\sigma^2}\|x - Hs_{<b_k=1>}\|^2 + b_{[k]}^T L_{A,[k]}\right\} - \max_{s,b_k=-1} * \left\{-\frac{1}{\sigma^2}\|x - Hs_{<b_k=-1>}\|^2 + b_{[k]}^T L_{A,[k]}\right\} \quad (Eq.\ 5)$$

where $$s_{<b_k=1>} = [\, s_1 \quad s_2 \quad \cdots \quad \cdots \quad s_M \,]_{<b_k=1>}$$

includes all the candidate solution vectors with $b_k=1$; $\sigma^2$ is the noise-variance;
$b_{[k]} = [b_1 \ldots b_{k-1}\ b_{k+1} \ldots ]$ is a sub-vector of bits obtained by excluding $b_k$;
$L_{A,[k]} = [L_{A,[1]} \ldots L_{A,[k-1]}\ L_{A,[k+1]} \ldots ]$ is a vector of a-priori LLR information on all corresponding bits present in the vector $b_{[k]}$; and
$\max^*(a,b) = \ln(e^a + e^b)$.

From the description of the list sphere decoder given above, the sphere radius "r" does NOT decrease with each iteration. As a result, the complexity increases greatly if the initial sphere radius is selected too large. Furthermore, both the quality of the computed LLR and the complexity increase with increasing values of $N_{cand}$. Eq. 5 is an equality if $N_{cand} = 2^{MM_c}$. In general, the performance and complexity of the above algorithm depend on "r" and $N_{cand}$.

Figure 7:
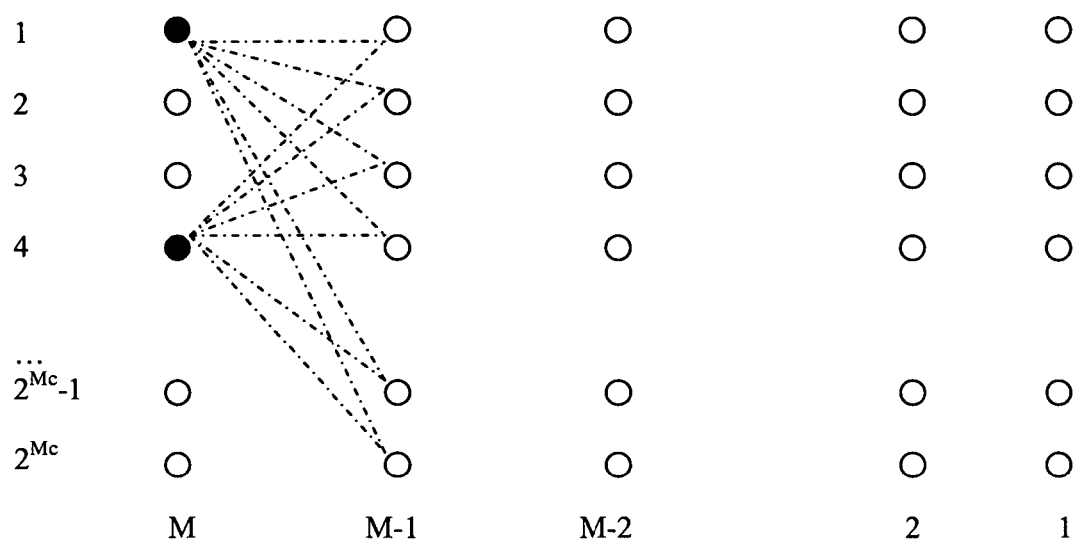
FIG. 7 shows a trellis diagram for list sphere trellis decoding.

FIG. 7 shows a trellis diagram for list sphere trellis decoding. The diagram has M stages corresponding to the rank of the MIMO transmission and $2^{M_c}$ states corresponding to the number of constellation points. For example, for a 16-QAM constellation and Rank 4 transmission, we have M=4 and Mc=4.

Similar to list sphere decoding, a parameter $N_{cand}$ may be specified, corresponding to the maximum number of entries maintained in the candidate list for each stage. In the example trellis shown in FIG. 7, $N_{cand}=2$. A possible algorithmic implementation of the general list sphere decoding algorithm is shown in FIG. 6.

Figure 6:
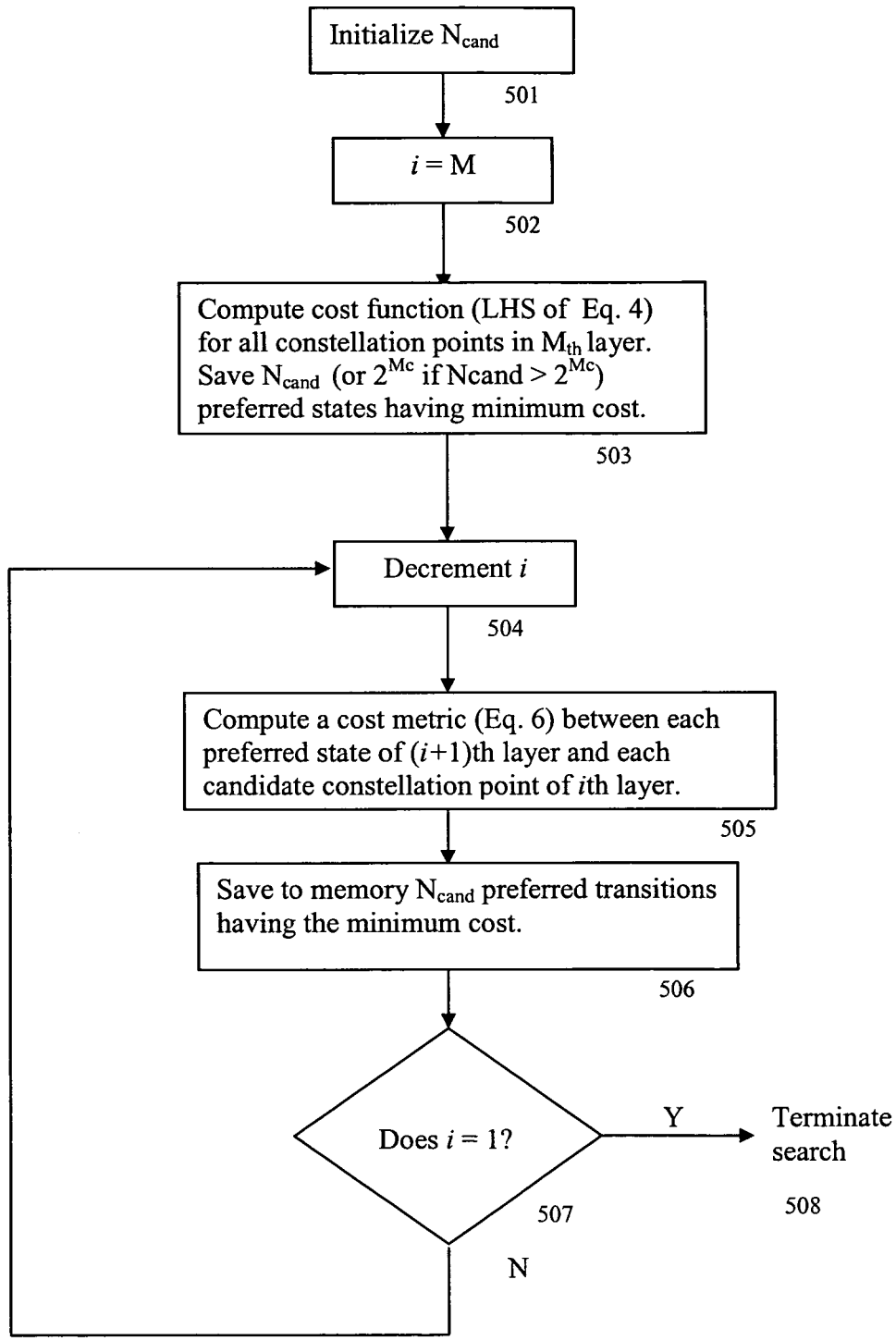
FIG. 6 shows a flow chart of another possible algorithmic implementation of a list sphere decoder.

In FIG. 6. first, an initialization of $N_{cad}$ is provided and set i=M, blocks 501-502 of FIG. 6. A cost function $R_{MM}^2\|s_M - \hat{s}_M\|^2$ is computed for all constellation point, block 503. In some aspects, only e $N_{cand}$ points that have the minimum cost are preserved. If $N_{cand} > 2^{Mc}$, then preserve only the $2^{Mc}$ points that have the minimum cost. In a trellis implementation of a decoder, e.g with reference to the trellis diagram of FIG. 7, these states are denoted by the shaded circles. These states can also be referred to as the "preferred" states.

For each of the preferred states selected i, a cost metric associated with each transition from a preferred state of the Mth layer to one of the $2^{Mc}$ candidate constellation points for the (M−1)th layer is computed. block 505. An individual cost metric can be computed as:

$$R_{M-1,M-1}^2 \left[ s_{M-1} - \hat{s}_{M-1} + \frac{R_{M-1,M}}{R_{M-1,M-1}}(\bar{s}_M - \hat{s}_M) \right]^2 + R_{MM}^2 \|s_M - \hat{s}_M\|^2 \quad (Eq.\ 6)$$

This creates a total of $N_{cand} 2^{Mc}$ candidate pairs $[s_M, s_{M-1}]$, each with an associated cost metric. The pairs are indicated by the "dotted lines" in FIG. 7, for a trellis implementation From a mathematical standpoint, it may be observed that the term $R_{MM}^2\|s_M - \hat{s}_M\|^2$ in Eq. 6 is essentially computed already been computed earlier in block 503 of FIG. 6, and thus need not be re-computed when performing later computations, e.g. in block 505. Further, the same observation applies to the cost metric computations at subsequent stages i, i.e., the state cost metric computed for the (i+1)th stage can be stored and re-used during computation of a state cost metric for the ith stage, or layer, of the trellis. Similarly, $$\frac{R_{M-1,M}}{R_{M-1,M-1}}(\bar{s}_M - \hat{s}_M)$$

need only be computed $N_{cand}$ times initially, and can also be stored and re-used for the rest of the $N_{cand} 2^{Mc}$ computations. The same observation applies with respect to the computation of metrics for the subsequent stages i.

Figure 8:
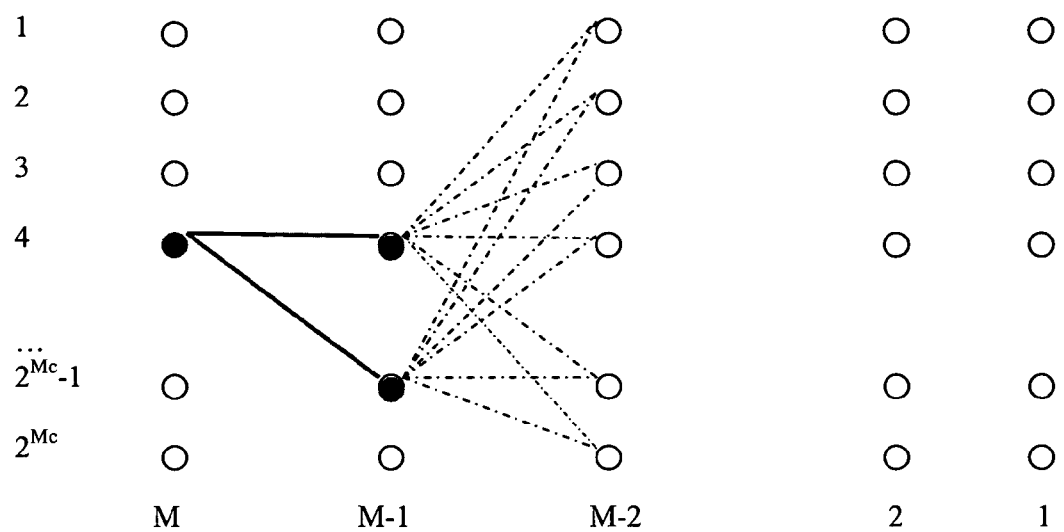
FIG. 8 shows candidate constellation pairs having minimum cost in the trellis diagram.

Then, from the $N_{cand} 2^{Mc}$ pairs or "dotted paths" shown in FIG. 7, save to memory only the $N_{cand}$ preferred transitions from layer M to layer M−1 having the minimum cost, block 506. Also save to memory the constellation points and costs associated with those preferred transitions. The pairs having minimum cost are denoted by the solid lines in FIG. 8. These paths and costs are stored along with the stored paths and costs from the previous layer to create a record of the trellis path traversed. These paths can also be referred to as the "preferred" transitions.

As illustrated by the loop back to the decrement block 504 in FIG. 5, blocks 505-507 are analogously performed for each subsequent layer up to layer 1. As previously described, only the $N_{cand}$ preferred transitions and associated constellation points/costs need be saved in memory for each layer.

Figure 9:
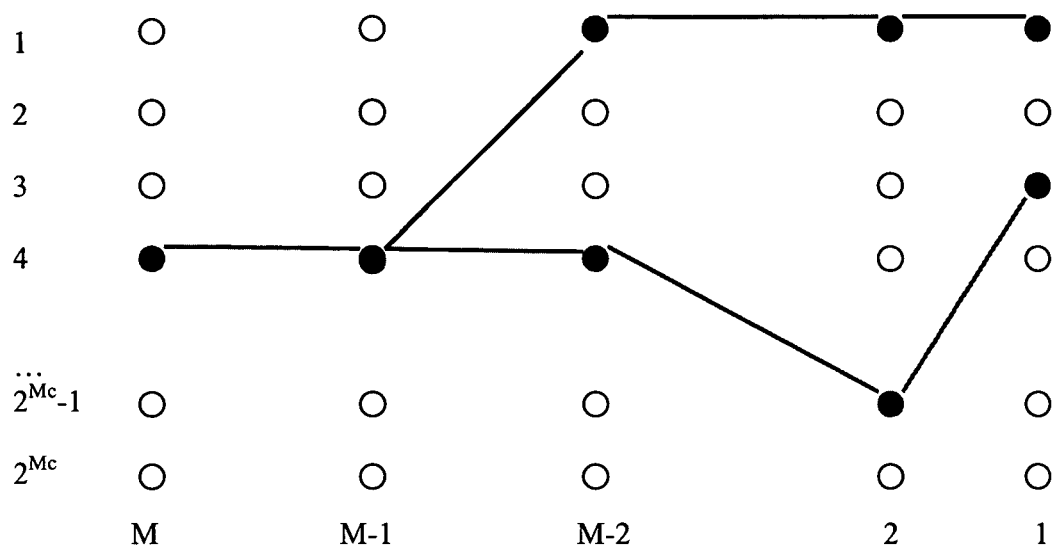
FIG. 9 shows the final trellis diagram with Nod paths and candidate solution vectors.

Once the layer 1 computations are finished, the final trellis diagram of FIG. 9 is obtained showing $N_{cand}$ paths and candidate solution vectors. Eq. 5 can subsequently be used to obtain the LLR for each bit.

As further refinements to the list sphere decoding algorithms, the optimization parameter $N_{cand}$ can be varied depending on the constellation size, as well as across stages, depending on channel conditions for each tone or group of tones, or other factors. In an embodiment, $N_{cand}$ may be dynamically adjusted to be greater in the presence of worse channel conditions, and lower in the presence of better channel conditions.

Note that in some aspects, the term $L_{a[k]}$ calculated in Eq. 5 can be omitted if unavailable, for example, if turbo-decoder iterations have yet to be performed, or if the turbo decoding is altogether decoupled from the list sphere decoding. In certain aspects, a list sphere decoder may be concatenated with a turbo decoder, and soft information calculated by the list sphere decoder may be iteratively exchanged with the turbo decoder, and vice versa, until a convergent solution is obtained.

Note also that, in general, the decoding procedure described herein may also be implemented using alternative criteria to identify preferred states of each layer. For example, instead of preserving only the $N_{cand}$ states or transitions having the lowest computed cost metrics, an implementation may preserve those states or transitions whose cost metrics meet certain other criteria, such as being below a preferred cost value. Such alternative criteria also fall within the scope of the present disclosure.

It should be noted, that the above procedures may easily be applied to multi-codeword (MCW) systems, wherein the constellation sizes vary across each stage. In an embodiment, $N_{cand}$ can be set a constant 256 across all stages to give acceptable performance for an SCW 4×4 MIMO system.

Further, while FIGS. 6-9 are generally discussed in the context of utilizing a trellis diagram, the above methodologies may be utilized without usage of a trellis methodology. For example, the cost metrics may calculated for each layer and constellation point for the layer, without using trellis diagram representation. In such a case, the above calculations may be made for MIMO layers, instead of trellis stages, and constellation point, instead of states of the trellis stages.

Figure 10:
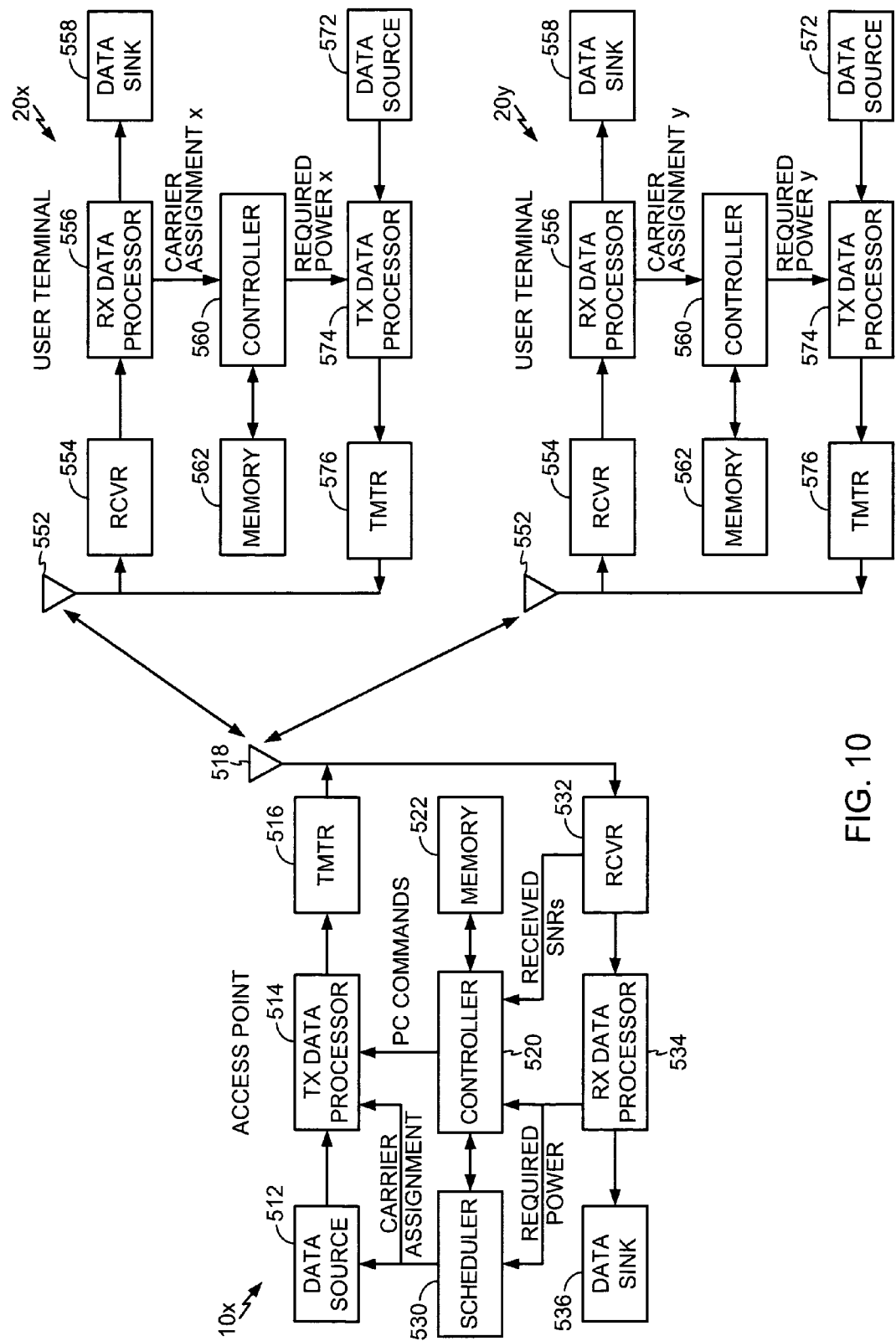
FIG. 10 shows a block diagram of an embodiment of an access point and two terminals.

FIG. 10 shows a block diagram of an embodiment of an AP 10*x* and two ATs 20*x* and 20*y* in multiple-access multi-carrier communication system 100. At AP 10*x*, a transmit (TX) data processor 514 receives traffic data (i.e., information bits) from a data source 512 and signaling and other information from a controller 520 and a scheduler 530. For example, controller 520 may provide power control (PC) commands that are used to adjust the transmit power of the active ATs, and scheduler 530 may provide assignments of carriers for the ATs. These various types of data may be sent on different transport channels. TX data processor 514 encodes and modulates the received data using multi-carrier modulation (e.g., OFDM) to provide modulated data (e.g., OFDM symbols). A transmitter unit (TMTR) 516 then processes the modulated data to generate a downlink modulated signal that is then transmitted from an antenna 518.

At each of ATs 20*x* and 20*y*, the transmitted and modulated signal is received by an antenna 552 and provided to a receiver unit (RCVR) 554. Receiver unit 554 processes and digitizes the received signal to provide samples. A received (RX) data processor 556 then demodulates and decodes the samples to provide decoded data, which may include recovered traffic data, messages, signaling, and so on. The traffic data may be provided to a data sink 558, and the carrier assignment and PC commands sent for the terminal are provided to a controller 560.

Controller 560 directs data transmission on the uplink using the resources that have been assigned to the terminal and indicated in the received assignment. Controller 560 further injects the erasure signature packets when the there is not actual data to transmit, yet desires to keep the assigned resources.

Controller 520 directs data transmission on the downlink using the resources that have been assigned to the terminal. Controller 520 further injects the erasure signature packets when the there is not actual data to transmit, yet desires to keep the assigned resources.

For each active terminal 120, a TX data processor 574 receives traffic data from a data source 572 and signaling and other information from controller 560. For example, controller 560 may provide information indicative of channel quality information, required transmit power, the maximum transmit power, or the difference between the maximum and required transmit powers for the terminal. The various types of data are coded and modulated by TX data processor 574 using the assigned carriers and further processed by a transmitter unit 576 to generate an uplink modulated signal that is then transmitted from antenna 552.

At AP 10*x*, the transmitted and modulated signals from the ATs are received by antenna 518, processed by a receiver unit 532, and demodulated and decoded by an RX data processor 534. Receiver unit 532 may estimate the received signal quality (e.g., the received signal-to-noise ratio (SNR)) for each terminal and provide this information to controller 520. Controller 520 may then derive the PC commands for each terminal such that the received signal quality for the terminal is maintained within an acceptable range. RX data processor 534 provides the recovered feedback information (e.g., the required transmit power) for each terminal to controller 520 and scheduler 530.

Scheduler 530 may provide an indication to controller 520 to maintain the resources. This indication is provided if more data is scheduled to be transmitted. For the AT 20*x*, the controller 560 may determine if resources required to be maintained. In certain aspects, controller 520 may perform instructions that provide the functionality of scheduler 530.

Further, controller 560 may perform all or some of the functions discussed with respect to FIGS. 1-9 with respect to the access terminal.

The techniques described herein may be implemented by various means. For example, these techniques may be implemented in hardware, software, or a combination thereof. For a hardware implementation, the processing units (e.g., controllers 520 and 560, TX and RX processors 514 and 534, and so on) for these techniques may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof.

For a software implementation, the techniques described herein may be implemented with modules (e.g., procedures, functions, and so on) that include the instructions that may be implemented by one or more processors to perform the functions described herein. The instructions may be stored in memory units, e.g., memory 522 in FIG. 10, on a removable media, or the like that may be read and executed by one or more processors (e.g., controllers 520). The memory unit(s)

may be implemented within the processor or external to the processor, in which case it can be communicatively coupled to the processor via various means as is known in the art.

Headings are included herein for reference and to aid in locating certain sections. These headings are not intended to limit the scope of the concepts described therein under, and these concepts may have applicability in other sections throughout the entire specification.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for list sphere decoding comprising:
    receiving at a receiver at least one codeword sent over a multiple-input multiple-output (MIMO) channel, wherein the at least one codeword comprises a plurality of layers, each layer comprising a constellation point of a plurality of candidate constellation points;
    for each layer, computing a state cost metric using said codeword for each constellation point of the at least one layer, and selecting preferred states of the at least one layer whose state cost metrics meet first preferred criteria; and
    for each of a plurality of constellation points of said layer, computing a state cost metric using said codeword for each transition from a preferred constellation point of said layer to each constellation point of a following layer, and selecting preferred transitions to said following layer whose state cost metrics meet second preferred criteria.

2. The method of claim 1, further comprising, for each layer, storing in a memory the state cost metrics associated with said selected preferred constellation points and transitions.

3. The method of claim 1, wherein meeting the first preferred criteria comprises being one of a candidate plurality of constellation point s having the lowest state costs for a constellation point.

4. The method of claim 3, wherein meeting the second preferred criteria comprises being one of a candidate plurality of transitions having the lowest constellation point costs for a layer.

5. The method of claim 4, wherein said candidate plurality can be variable across layers, and can be a function of the number of candidate constellation points for each layer.

6. The method of claim 5, wherein said codeword is a multiple-code word (MCW).

7. The method of claim 4, wherein said codeword is a single-code word (SCW).

8. The method of claim 1, further comprising storing in a memory said constellation point cost metric for a stage after computation, and re-using said stored metric when computing a constellation point cost metric during a following layer.

9. The method of claim 1, further comprising determining candidate codewords from said preferred constellation points and said preferred transitions.

10. The method of claim 9, further comprising computing overall cost metrics for said candidate codewords.

11. The method of claim 10, further comprising selecting a candidate codeword having the lowest overall cost metric.

12. The method of claim 1, wherein the first and second preferred criteria are met when a computed constellation point cost metric is one of a candidate plurality of constellation point cost metrics having the lowest values for a given layer, and wherein said candidate plurality can be variable across layers.

13. The method of claim 12, wherein said candidate plurality is constant for all layers.

14. The method of claim 1, wherein the first preferred criteria are met when a computed state cost metric is lower than a specified threshold.

15. The method of claim 1, further comprising calculating a soft extrinsic information metric for each bit.

16. The method of claim 15, wherein said soft extrinsic information metric for each bit is provided to a turbo decoder.

17. The method of claim 16, wherein said turbo decoder further generates an additional soft extrinsic information metric for each bit.

18. The method of claim 17, wherein each layer comprises a stage of a trellis and each constellation point comprises a state of one stage of the trellis.

19. A decoding method comprising:
    receiving a codeword comprising a plurality of symbols, each symbol corresponding to at least one of a plurality of candidate constellation points;
    for a first symbol:
    computing a cost metric for each candidate constellation point of said first symbol;
    storing in a memory only those candidate constellation points whose computed cost metrics meet first preferred criteria;
    for each following symbol, and for each candidate constellation point previously stored in said memory for the symbol immediately preceding said following symbol:
    computing a cost metric for each candidate transition from said previously stored candidate constellation point to a candidate constellation point of said following symbol; and
    storing in said memory only those candidate transitions whose computed cost metrics meet second preferred criteria.

20. The method of claim 19, further comprising determining candidate codewords from the candidate constellation points and candidate transitions stored in said memory.

21. The method of claim 19, wherein said codeword is transmitted over a MIMO channel, and said symbols of said codeword are simultaneously transmitted on different antennas over said MIMO channel.

22. The method of claim 21, wherein said MIMO channel is characterized by a channel matrix H; further comprising providing an upper triangular matrix R related to the matrix H by a unitary transformation, and wherein said computed cost metric for each symbol is a function of the coefficients in the rows of the matrix R corresponding to said symbol and all symbols preceding said symbol.

23. The method of claim 19, wherein meeting said first preferred criteria comprises being a candidate constellation point having an associated cost metric that is one of the a first candidate plurality of lowest cost metrics for all candidate constellation points.

24. The method of claim 23, wherein said first candidate plurality is less than the total number of candidate constellation points for a symbol.

25. The method of claim 24, wherein meeting said second preferred criteria comprises being a candidate transition having an associated cost metric that is one of a second candidate plurality of lowest cost metrics for all candidate transitions for that symbol, wherein said second candidate plurality is less than the total number of candidate transitions from a candidate constellation point of the preceding symbol to a candidate constellation point of the following symbol, and wherein said first candidate plurality is equal to said second candidate plurality.

26. The method of claim 19, wherein meeting said second preferred criteria comprises being a candidate transition having an associated cost metric that is one of a second candidate plurality of lowest cost metrics for all candidate transitions.

27. The method of claim 26, wherein said second candidate plurality is less than the total number of candidate transitions from a candidate constellation point of the preceding symbol to a candidate constellation point of the following symbol.

28. The method of claim 19, wherein each of said following symbols comprises a symbol following in time.

29. The method of claim 19, wherein each of said following symbols comprises a symbol following in rank.

30. A decoder apparatus comprising:
a receiver configured to receive at least one codeword sent over a multiple-input multiple-output (MIMO) channel, wherein the at least one codeword comprises a plurality of layers, each layer comprising a constellation point selected from a plurality of candidate constellation points; and
a processor configured to, for at least one layer, compute a constellation point metric for the at least one layer, and to select preferred constellation points of the at least one layer whose state cost metrics meet first preferred criteria; the processor further configured to compute a constellation point cost metric for each transition from a preferred constellation point of the layer to each constellation point of a following layer, and selecting preferred transitions to said following layer whose constellation point cost metrics meet second preferred criteria.

31. The apparatus of claim 30, further comprising a memory for storing, for each stage, the state cost metrics associated with the preferred states and the preferred transitions.

32. The apparatus of claim 30, wherein meeting the first preferred criteria comprises being one of a candidate plurality states having the lowest state costs for the stage.

33. The apparatus of claim 32, wherein meeting the second preferred criteria comprises being one of said candidate plurality of transitions having the lowest state costs for the stage.

34. The apparatus of claim 33, wherein the MIMO channel is characterized by a channel matrix H, wherein the rank of the matrix H is M, further comprising providing an upper triangular matrix R related to said channel matrix H, wherein said state cost metric for each state of the number of stages is expressed as $R_{MM}^2 \|s_M - \hat{s}_M\|^2$, and wherein the state cost metric of said Mth stage is expressed as $R_{MM}^2 \|s_M - \hat{s}_M\|^2$, wherein:

R is an upper triangular matrix related to the matrix H by a unitary transformation;
RMM denotes the entry of said matrix R corresponding to the Mth row and the Mth column;
sM denotes a candidate constellation point of the Mth layer; and
$\hat{s}_M$ denotes the Mth entry of the zero-forcing solution $\hat{s} = (H^*H)^{-1}H^*x$.

35. The apparatus of claim 34, wherein the state cost metric for each transition of the ith stage is expressed as follows:

$$\sum_{i}^{M} R_{ii}^2 \left[ s_i - \hat{s}_i + \sum_{j=i+1}^{M} \frac{R_{ij}}{R_{ii}}(s_j - \hat{s}_j) \right]^2;$$

wherein
i denotes an index to a stage of the trellis;
Rij denotes the entry of the R matrix corresponding to the ith row and the jth column;
si denotes a candidate constellation point of the ith layer; and
$\hat{s}_i$ denotes the ith entry of the zero-forcing solution $\hat{s} = (H^*H)^{-1}H^*x$.

36. The apparatus of claim 30, further comprising a soft information processor for computing soft extrinsic information for each bit associated with each constellation point associated with each layer of a candidate codeword, wherein a candidate codeword can be determined from said preferred states and preferred transitions.

37. A processor readable media comprising instructions thereon that may be utilized by a processor, the instructions comprising:
instructions for a first symbol, of a codeword comprising a plurality of symbols, each symbol corresponding to at least one of a plurality of candidate constellation points, computing a cost metric for each candidate constellation point of said first symbol;
instructions for storing in a memory only those candidate constellation points whose computed cost metrics meet first preferred criteria; and
instructions, for each following symbol and for each candidate constellation point previously stored in said memory for the symbol immediately preceding said following symbol, computing a cost metric for each candidate transition from said previously stored candidate constellation point to a candidate constellation point of said following symbol.

38. The processor readable media of claim 37, further comprising instructions for storing in said memory only those candidate transitions whose computed cost metrics meet second preferred criteria.

* * * * *